(12) United States Patent
Shimizu et al.

(10) Patent No.: US 8,354,696 B2
(45) Date of Patent: Jan. 15, 2013

(54) SEMICONDUCTOR DEVICE AND LAYOUT DESIGN APPARATUS OF SEMICONDUCTOR DEVICE

(75) Inventors: Yoshiaki Shimizu, Tokyo (JP); Kazuhiko Matsuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 139 days.

(21) Appl. No.: 12/979,142

(22) Filed: Dec. 27, 2010

(65) Prior Publication Data

US 2011/0156101 A1    Jun. 30, 2011

(30) Foreign Application Priority Data

Dec. 28, 2009    (JP) ................................ 2009-297750

(51) Int. Cl.
*H01L 27/118* (2006.01)
(52) U.S. Cl. .......... 257/203; 257/E27.107; 257/E27.105
(58) Field of Classification Search .................. 257/203, 257/E27.105, E27.107
See application file for complete search history.

(56) References Cited

U.S. PATENT DOCUMENTS

| | | | | |
|---|---|---|---|---|
| 5,917,342 A * | 6/1999 | Okamura | ...................... | 326/103 |
| 6,291,869 B1 * | 9/2001 | Ooishi | ........................... | 257/500 |
| 7,266,787 B2 * | 9/2007 | Hughes et al. | ................ | 257/374 |
| 7,667,485 B2 * | 2/2010 | Sakata et al. | .................... | 326/34 |
| 7,784,012 B2 * | 8/2010 | Correale, Jr. | ................... | 257/369 |
| 2007/0278528 A1 * | 12/2007 | Ato et al. | ...................... | 257/207 |

FOREIGN PATENT DOCUMENTS

JP    2007-324409    12/2007

* cited by examiner

*Primary Examiner* — Victor A Mandala
(74) *Attorney, Agent, or Firm* — Morrison & Foerster LLP

(57) ABSTRACT

A semiconductor device may include a plurality of logic circuits connected to each other through input and output terminals thereof. The plurality of logic circuits comprising a first sub-plurality of logic circuits coupled to a first one of different power systems. The first sub-plurality of logic circuits is laid out and adjacent to each other in a first direction. The first sub-plurality of logic circuits includes a first logic circuit and a second logic circuit. The second logic circuit is adjacent to the first logic circuit. The first logic circuit includes a first element comprising a first diffusion layer. The second logic circuit includes a second element comprising the first diffusion layer.

20 Claims, 12 Drawing Sheets

US 8,354,696 B2

SEMICONDUCTOR DEVICE AND LAYOUT DESIGN APPARATUS OF SEMICONDUCTOR DEVICE

BACKGROUND OF THE INVENTION

1. Field of the Invention

The present invention relates to a semiconductor device and a layout design apparatus of a semiconductor device. More particularly, the present invention relates to a semiconductor device including logic circuits having different power supply lines which are alternately connected to the logic circuits, and a layout design apparatus of the semiconductor device.

Priority is claimed on Japanese Patent Application First Publication, No. 2009-297750, filed Dec. 28, 2009, the content of which is incorporated herein by reference.

2. Description of the Related Art

As an example of a general semiconductor device, an inverter circuit (INV) circuit, a MOS logic circuit, including N-channel MOS transistors (NMOS transistors) and P-channel MOS transistors (PMOS transistors) are shown in FIGS. 10A and 10B. FIG. 10A is a view illustrating an example of a layout of the inverter circuit. FIG. 10B is a view illustrating a circuit diagram of the inverter circuit. FIG. 10C is a view illustrating a symbol of the inverter circuit.

In FIG. 10A, the inverter circuit includes a PMOS transistor P1 and an NMOS transistor N1. The gate electrodes Gp of the PMOS transistor P1 and the gate electrodes On of the NMOS transistor N1 are coupled to a gate wiring Jg which is formed on an upper wiring layer The gate wiring Jg is not shown in the figure. The drain electrode Dp of the PMOS transistor P1 and the drain electrode Dn of the NMOS transistor N1 are connected to a drain wiring Jd.

The PMOS transistor P1 is formed in a diffusion layer 101. The source electrodes of the PMOS transistor P1 is coupled to a power source line (VCC) through wiring layers M1$n$ and Via-1. The drain electrode Dp of the PMOS transistor P1 is coupled to the drain electrode Dn of the NMOS transistor N1. The power source line may be referred to as a power supply line. The source electrodes of the NMOS transistor N1 are connected to a ground line GND (VSS) through wiring layers M1$p$ and Via-2.

FIG. 11A is a view illustrating a layout of two inverter circuits INV1 and INV2 for forming a series connection of the inverter circuits INV1 and INV2. The inverter circuits INV1 and INV2 are adjacently formed. The inverter circuit INV1 includes a PMOS transistor P1 and an NMOS transistor N1. The inverter circuit INV2 includes a PMOS transistor P2 and an NMOS transistor N2. QP1 indicates a source diffusion layer of the PMOS transistor P1. QN1 indicates a source diffusion layer of the NMOS transistor N1. Further, QP2 indicates a source diffusion layer of the PMOS transistor P2. QN2 indicates a source diffusion layer of the NMOS transistor N2. In the figure, the source diffusion layers QP1 and QP2 are adjacent, and the source diffusion layers QN1 and QN2 are adjacent.

FIG. 11B is a view illustrating an example of a layout of the inverter circuits INV1 and INV2 in a reduced layout area of the inverter circuits INV1 and INV2. A diffusion layer QP1 (QP2) is used for the diffusion layer QP1 of the PMOS transistor P1 and the diffusion layer QP2 of the PMOS transistor P2. The diffusion layer QP1(QP2) may be referred to as a common diffusion layer QP1(QP2). A diffusion layer QN1 (QN2) is used for the diffusion layer QN1 of the NMOS transistor N1 and the diffusion layer QN2 of the NMOS transistor N2. The diffusion layer QN1(QN2) may be referred to as a common diffusion layer QN1(QN2). Further, the common diffusion layer QP1(QP2) is connected to a wiring M1(Sp12), and the common diffusion layer QN1(QN2) is connected to a wiring M1(Sn12). In this way, a common diffusion layer is used for the diffusion layers of adjacent sources. The diffusion layers to be connected to the power source of the inverter circuits INV1 and INV2 are coupled to another common diffusion layer. Thereby, the total layout area of inverter circuits INV1 and INV2 can be reduced. FIG. 11C indicates a symbol of the inverter circuits formed in series connections.

There is another type of logic circuits in which series-connected logic circuits of a semiconductor device are driven by different power source lines. In this case, the different power source lines are alternately coupled to the series-connected logic circuits. Recently, this type of power supply configuration is increasingly used for semiconductor devices, such as DRAMs (dynamic random access memories), since they are installed in a mobile device or the like. Namely, such logic circuits can be used for reducing current consumption of the semiconductor devices.

In this case, the logic circuits include a sub-power source line and a sub-ground line (GND) in addition to a primary power source line and a primary ground line. The sub-power source line is coupled to a sub-power supply providing a sub-voltage (sub-electrical potential). The sub-ground line (GND) is coupled to a sub-ground supply which provides a sub-ground potential. The primary power source line is coupled to a primary voltage supply which provides a primary electrical potential. The primary ground line is coupled to a primary ground supply which provides a primary ground potential. Japanese Patent Application First Publication, No. 2007-324409 and United States Patent Application, Publication No. 2007-0278528, describe that the sub-power source line enables MOS transistors to reduce current consumption of the sub-threshold current of MOS transistors. Such power supply system, which provides different power supply lines for the circuits, may be referred to as a current source control configuration.

SUMMARY

In one embodiment, a semiconductor device may include, but is not limited to, a plurality of logic circuits which is connected to each other through input and output terminals thereof. The plurality of logic circuits includes a first sub-plurality of logic circuits coupled to a first one of different power systems and a second sub-plurality of logic circuits coupled to a second one of the different power systems. The first sub-plurality of logic circuits is laid out and adjacent to each other in a first direction. The second sub-plurality of logic circuits is laid out and adjacent to each other in the first direction. The first sub-plurality of logic circuits and the second sub-plurality of logic circuits are laid out and adjacent to each other in the first direction. The first sub-plurality of logic circuits includes a first logic circuit and a second logic circuit. The second logic circuit is adjacent to the first logic circuit. The second sub-plurality of logic circuits includes a third logic circuit and a fourth logic circuit. The fourth logic circuit is adjacent to the third logic circuit. The first logic circuit includes a first element which includes a first diffusion layer. The second logic circuit includes a second element which includes a second diffusion layer. The third logic circuit includes a third element which includes a third diffusion layer. The fourth logic circuit includes a fourth element which includes a fourth diffusion layer. In this case, a first common diffusion layer is shared by the first diffusion layer and the second diffusion layer. A second common diffusion layer is shared by the third diffusion layer and the fourth diffusion layer. The second logic circuit further includes a fifth element which includes a fifth diffusion layer. The third logic circuit further includes a sixth element which includes a sixth diffusion layer. The fifth diffusion layer and the sixth diffusion layer adjoin without including other diffusion layers. The fifth diffusion layer and the sixth diffusion layer are mutually separated.

In another embodiment, a semiconductor device may include, but is not limited to, a first circuit, a second circuit and a fifth circuit. In this case, each of the first, second and fifth circuits is driven between a first power supply line having a first electrical potential and a second power supply line having a second electrical potential. The first electrical potential is higher than the second electrical potential. The first circuit includes a first diffusion layer and a third diffusion layer. The second circuit includes a second diffusion layer and a fourth diffusion layer. The semiconductor device includes a third circuit and a fourth circuit. Each of the third and fourth circuits is driven between a third power supply line having a third electrical potential and a fourth power supply line having a fourth electrical potential. The third electrical potential is higher than the fourth electrical potential. The third circuit includes a fifth diffusion layer and a seventh diffusion layer. The fourth circuit includes a sixth diffusion layer and an eighth diffusion layer. In this case, a second output terminal of the second circuit is connected through a first wiring to a fourth input terminal of the fourth circuit. A fourth output terminal of the fourth circuit is connected through a second wiring to a fifth input terminal of the fifth circuit. A fifth output terminal of the fifth circuit is connected through a third wiring to a third input terminal of the third circuit. A third output terminal of the third circuit is connected through a fourth wiring to a first input terminal of the first circuit. A second input terminal of the second circuit receives an input signal. A first output terminal of the first circuit outputs an output signal. The first, second, third, fourth and fifth circuits are disposed in series in a first direction. A first common diffusion layer is shared by the first diffusion layer and the second diffusion layer. The first and second diffusion layers are associated with the first power supply line. A second common diffusion layer is shared by the third diffusion layer and the fourth diffusion layer. The third and fourth diffusion layers are associated with the second power supply line. A third common diffusion layer is shared by the fifth diffusion layer and the sixth diffusion layer. The fifth and sixth diffusion layers are associated with the third power supply line. A fourth common diffusion layer is shared by the seventh diffusion layer and the eighth diffusion layer. The seventh and eighth diffusion layers are associated with the fourth power supply line. A first signal propagates on the first wiring in the first direction. A second signal propagates on the second wiring in the first direction. A third signal propagates on the third wiring in a second direction being opposite to the first direction, and a fourth signal propagates on the fourth wiring in the second direction.

In still another embodiment, a semiconductor device may include, but is not limited to, a first circuit and a second circuit. Each of the first and second circuits is driven between a first power supply line having a first electrical potential and a second power supply line having a second electrical potential. The first electrical potential is higher than the second electrical potential. The first circuit includes a first diffusion layer and a third diffusion layer. The second circuit includes a second diffusion layer and a fourth diffusion layer. The semiconductor device may include, but is not limited to, a third circuit and a fourth circuit. Each of the third and fourth circuits is driven between a third power supply line having a third electrical potential and a fourth power supply line having a fourth electrical potential. The third electrical potential is higher than the fourth electrical potential. The third circuit includes a fifth diffusion layer and a seventh diffusion layer. The fourth circuit includes a sixth diffusion layer and an eighth diffusion layer. In this case, a first output terminal of the first circuit is connected through a first wiring to a third input terminal of the third circuit. A third output terminal of the third circuit is connected through a second wiring to a second input terminal of the second circuit. A second output terminal of the second circuit is connected through a third wiring to a fourth input terminal of the fourth circuit. A first input terminal of the first circuit receives an input signal. A fourth output terminal of the fourth circuit outputs a first output signal. The first, second, third, and fourth circuits are disposed in series in a first direction. A first common diffusion layer is shared by the first diffusion layer and the second diffusion layer. The first and second diffusion layers are associated with the first power supply line. A second common diffusion layer is shared by the third diffusion layer and the fourth diffusion layer. The third and fourth diffusion layers are associated with the second power supply line. A third common diffusion layer is shared by the fifth diffusion layer and the sixth diffusion layer. The fifth and sixth diffusion layers are associated with the third power supply line. A fourth common diffusion layer is shared by the seventh diffusion layer and the eighth diffusion layer. The seventh and eighth diffusion layers are associated with the fourth power supply line. A first signal propagates on the first wiring in the first direction. A third signal propagates on the third wiring in the first direction, and a second signal propagates on the second wiring in a second direction being opposite to the first direction.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail, in order to facilitate the understanding of the present invention. Descriptions will be given below for a circuit having the current source control configuration used as an example of one of different power supply systems.

In accordance with the semiconductor device suggested in Japanese Patent Application First Publication, No. 2007-324409, the diffusion layers of inverter circuits are connected to different power supplies (supply lines). Descriptions will be given for an example of the related art with reference to FIGS. 10A, 10B and 10C and FIGS. 11A, 11B and 11C. In this case, the wirings of a primary and a sub-power supply system are coupled to the diffusion layers through the wiring layers M1. The wirings of the primary and sub-power supply systems are formed to align with the diffusion layers, in which the alignment is made based on a plan view of the top of the semiconductor device. Further, intermediate layers, the wirings M1, are formed between the aligned wirings of the primary and the sub-power supply systems. The wirings M1 cross the wirings of the primary and sub-power supply lines.

In this way, the total wiring layout area of the logic circuits having series connections is reduced. In this case, the logic circuits are supplied their power from different power supply systems. The logic circuits having different power supply systems are arranged alternately in a layout and supplied the power from the individual power supply systems (lines).

Figure 11A:
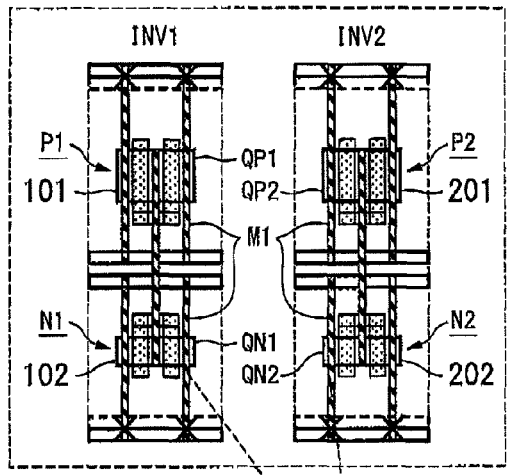
FIG. 11A is a view illustrating an example of a layout of two inverter circuits connected in series formed in a cell.
Figure 11C:
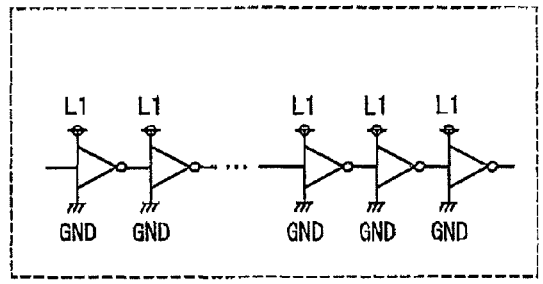
FIG. 11C is a diagram illustrating symbols of the inverter circuits connected in series.
Figure 11B:
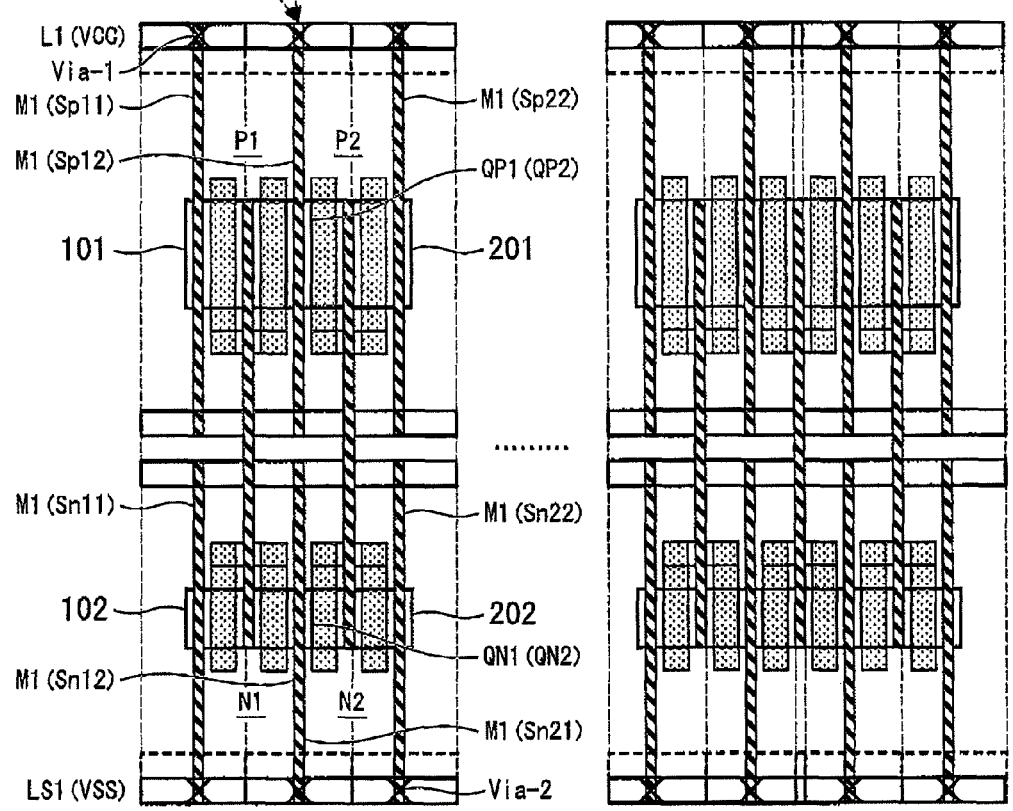
FIG. 11B is a view illustrating an example of a layout of two inverter circuits connected in series where common diffusion layers are used.

As discussed above, the method described in Japanese Patent Application First Publication, No. 2007-324409 reduces the total wiring layout area of the logic circuits. In this case, the logic circuits are connected in series. The logic circuits are supplied the power from different power supply systems. Further, the wirings of the primary power supply system and the sub-power supply system are aligned with the diffusion layers. The alignment is made based on a plan view of the top of the semiconductor device. Thus the method reduces the total size of the semiconductor device. On the other hand, if adjacent logic circuits are coupled to different power supply systems as illustrated in FIG. 11C, where inverter circuits are connected in series, the common diffusion layers cannot be formed for those adjacent inverter circuits of the logic circuits, because different Potentials (voltages) are required to drive the adjacent inverter circuits. Thus, the layout area of the semiconductor device cannot be reduced based on the method of the common diffusion layers unlike the case of FIG. 11B.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a plurality of logic circuits which is connected to each other through input and output terminals thereof. The plurality of logic circuits includes a first sub-plurality of logic circuits coupled to a first one of different power systems and a second sub-plurality of logic circuits coupled to a second one of the different power systems. The first sub-plurality of logic circuits is laid out and adjacent to each other in a first direction. The second sub-plurality of logic circuits is laid out and adjacent to each other in the first direction. The first sub-plurality of logic circuits and the second sub-plurality of logic circuits are laid out and adjacent to each other in the first direction. The first sub-plurality of logic circuits includes a first logic circuit and a second logic circuit. The second logic circuit is adjacent to the first logic circuit. The second sub-plurality of logic circuits includes a third logic circuit and a fourth logic circuit. The fourth logic circuit is adjacent to the third logic circuit. The first logic circuit includes a first element which includes a first diffusion layer. The second logic circuit includes a second element which includes a second diffusion layer. The third logic circuit includes a third element which includes a third diffusion layer. The fourth logic circuit includes a fourth element which includes a fourth diffusion layer. In this case, a first common diffusion layer is shared by the first diffusion layer and the second diffusion layer. A second common diffusion layer is shared by the third diffusion layer and the fourth diffusion layer. The second logic circuit further includes a fifth element which includes a fifth diffusion layer. The third logic circuit further includes a sixth element which includes a sixth diffusion layer. The fifth diffusion layer and the sixth diffusion layer adjoin without including other diffusion layers. The fifth diffusion layer and the sixth diffusion layer are mutually separated.

In some cases, the semiconductor device may include, but is not limited to, the plurality of logic circuits which includes the second and fourth logic circuits forming a first signal path, the first and third logic circuits forming a second signal path, and the first and second paths forming a first single signal path.

In some cases, the semiconductor device may include, but is not limited to, a first signal which propagates on the first signal path in a first signal direction, and a second signal which propagates on the second signal path in a second signal direction being opposite to the first signal direction.

In some cases, the semiconductor device may include, but is not limited to, the first sub-plurality of logic circuits which includes a fifth logic circuit, in which the fourth logic circuit and the fifth logic circuit form a third signal path, the fifth logic circuit and the third logic circuit form a fourth signal path, and the first through fourth signal paths form the first single signal path.

In some cases, the semiconductor device may include, but is not limited to, the first sub-plurality of logic circuits which includes a fifth logic circuit, in which the fourth logic circuit and the fifth logic circuit form a third signal path, the fifth logic circuit and the third logic circuit form a fourth signal path, and the first through fourth signal paths form the first single signal path.

In some cases, the semiconductor device may include, but is not limited to, the first signal which propagates on the first signal path in the first signal direction. A third signal propagates on the third signal path in the first signal direction, the second signal propagates on the second signal path in a second signal direction being opposite to the first signal direction, and a fourth signal propagates on the fourth signal path in the second signal direction.

In some cases, the semiconductor device may include, but is not limited to, the first signal which propagates on the first signal path in the first signal direction, and the second signal propagates on the second signal path in the first signal direction.

In some cases, the semiconductor device may includes, but is not limited to, the third logic circuit and the second logic circuit, which form a fifth signal path. A fifth signal propagates on the fifth signal path in the second signal direction being opposite to the first signal direction.

In some cases, the semiconductor device may includes, but is not limited to, the first sub-plurality of logic circuits, in which each of the first sub-plurality of logic circuits forms a first signal path which bypasses other logic circuits included in the first sub-plurality of logic circuits, and each of the second sub-plurality of logic circuits forms a second signal path which bypasses other logic circuits included in the second sub-plurality of logic circuits.

In some cases, the semiconductor device may includes, but is not limited to, the first sub-plurality of logic circuits, in which each of the first sub-plurality of logic circuits bypasses other logic circuits included in the first sub-plurality of logic circuits, and each of the second sub-plurality of logic circuits bypasses other logic circuits included in the second sub-plurality of logic circuits.

In some cases, the semiconductor device may includes, but is not limited to, the first sub-plurality of logic circuits, in which each of the first sub-plurality of logic circuits bypasses other logic circuits included in the first sub-plurality of logic circuits, and each of the second sub-plurality of logic circuits bypasses other logic circuits included in the second sub-plurality of logic circuits.

In some cases, the semiconductor device may include, but is not limited to, the first sub-plurality of logic circuits, in which each of the first sub-plurality of logic circuits bypasses other logic circuits included in the first sub-plurality of logic circuits, and each of the second sub-plurality of logic circuits bypasses other logic circuits included in the second sub-plurality of logic circuits.

In some cases, the semiconductor device may include, but is not limited to, the first, second, third, fourth, fifth and sixth elements, in which each of the first, second, third, fourth, fifth and sixth elements is a field effect transistor, and each of the first, second, third, fourth, fifth and sixth diffusion layers is one of electrodes, of the field effect transistor.

In another embodiment, a semiconductor device may include, but is not limited to, a first circuit, a second circuit and a fifth circuit. In this case, each of the first, second and fifth circuits is driven between a first power supply line having a first electrical potential and a second power supply line having a second electrical potential. The first electrical potential is higher than the second electrical potential. The first circuit includes a first diffusion layer and a third diffusion layer. The second circuit includes a second diffusion layer and a fourth diffusion layer. The semiconductor device includes a third circuit and a fourth circuit. Each of the third and fourth circuits is driven between a third power supply line having a third electrical potential and a fourth power supply line having a fourth electrical potential. The third electrical potential is higher than the fourth electrical potential. The third circuit includes a fifth diffusion layer and a seventh diffusion layer. The fourth circuit includes a sixth diffusion layer and an eighth diffusion layer. In this case, a second output terminal of the second circuit is connected through a first wiring to a fourth input terminal of the fourth circuit. A fourth output terminal of the fourth circuit is connected through a second wiring to a fifth input terminal of the fifth circuit. A fifth output terminal of the fifth circuit is connected through a third wiring to a third input terminal of the third circuit. A third output terminal of the third circuit is connected through a fourth wiring to a first input terminal of the first circuit. A second input terminal of the second circuit receives an input signal. A first output terminal of the first circuit outputs an output signal. The first, second, third, fourth and fifth circuits are disposed in series in a first direction. A first common diffusion layer is shared by the first diffusion layer and the second diffusion layer. The first and second diffusion layers are associated with the first power supply line. A second common diffusion layer is shared by the third diffusion layer and the fourth diffusion layer. The third and fourth diffusion layers are associated with the second power supply line. A third common diffusion layer is shared by the fifth diffusion layer and the sixth diffusion layer. The fifth and sixth diffusion layers are associated with the third power supply line. A fourth common diffusion layer is shared by the seventh diffusion layer and the eighth diffusion layer. The seventh and eighth diffusion layers are associated with the fourth power supply line. A first signal propagates on the first wiring in the first direction. A second signal propagates on the second wiring in the first direction. A third signal propagates on the third wiring in a second direction being opposite to the first direction, and a fourth signal propagates on the fourth wiring in the second direction.

In still another embodiment, a semiconductor device may include, but is not limited to, a first circuit and a second circuit. Each of the first and second circuits is driven between a first power supply line having a first electrical potential and a second power supply line having a second electrical potential. The first electrical potential is higher than the second electrical potential. The first circuit includes a first diffusion layer and a third diffusion layer. The second circuit includes a second diffusion layer and a fourth diffusion layer. The semiconductor device may include, but is not limited to, a third circuit and a fourth circuit. Each of the third and fourth circuits is driven between a third power supply line having a third electrical potential and a fourth power supply line having a fourth electrical potential. The third electrical potential is higher than the fourth electrical potential. The third circuit includes a fifth diffusion layer and a seventh diffusion layer. The fourth circuit includes a sixth diffusion layer and an eighth diffusion layer. In this case, a first output terminal of the first circuit is connected through a first wiring to a third input terminal of the third circuit. A third output terminal of the third circuit is connected through a second wiring to a second input terminal of the second circuit. A second output terminal of the second circuit is connected through a third wiring to a fourth input terminal of the fourth circuit. A first input terminal of the first circuit receives an input signal. A fourth output terminal of the fourth circuit outputs a first output signal. The first, second, third, and fourth circuits are disposed in series in a first direction. A first common diffusion layer is shared by the first diffusion layer and the second diffusion layer. The first and second diffusion layers are associated with the first power supply line. A second common diffusion layer is shared by the third diffusion layer and the fourth diffusion layer. The third and fourth diffusion layers are associated with the second power supply line. A third common diffusion layer is shared by the fifth diffusion layer and the sixth diffusion layer. The fifth and sixth diffusion layers are associated with the third power supply line. A fourth common diffusion layer is shared by the seventh diffusion layer and the eighth diffusion layer. The seventh and eighth diffusion layers are associated with the fourth power supply line. A first signal propagates on the first wiring in the first direction. A third signal propagates on the third wiring in the first direction, and a second signal propagates on the second wiring in a second direction being opposite to the first direction.

In some cases, the semiconductor device may include, but is not limited to, a fifth circuit and a sixth circuit. Each of the fifth and sixth circuits is driven between the first power supply line and the second power supply line. The fifth circuit includes a tenth diffusion layer, a twelfth diffusion layer, a thirteenth diffusion layer and a fifteenth diffusion layer, in which the sixth circuit includes a fourteenth diffusion layer and a sixteenth diffusion layer. The semiconductor device includes a seventh circuit and an eighth circuit. Each of the seventh and eighth circuits is driven between the third power supply line and the fourth power supply line. The first, second, fifth, sixth, third, fourth, seventh and eighth circuits are disposed in series in a first direction. The seventh circuit includes an eighteenth diffusion layer, a twentieth diffusion layer, a twenty-first diffusion layer and a twenty-third diffusion layer. The eighth circuit includes a twenty-second diffusion layer and a twenty-fourth diffusion layer. The second circuit further includes a ninth diffusion layer and an eleventh diffusion layer. The fourth circuit further includes a seventeenth diffusion layer and a nineteenth diffusion layer. In this case, the fourth output terminal of the fourth circuit is connected through a fourth wiring to a fifth input terminal of the fifth circuit, a fifth output terminal of the fifth circuit is connected through a fifth wiring to a seventh input terminal of the seventh circuit, a seventh output terminal of the seventh circuit is connected through a sixth wiring to a sixth input terminal of the sixth circuit, a sixth output terminal of the sixth circuit is connected through a seventh wiring to an eighth input terminal of the eighth circuit. An eighth output terminal of the eighth circuit outputs a second output signal. A fifth common diffusion layer is shared by the ninth diffusion layer and the tenth diffusion layer. The ninth and tenth diffusion layers are associated with the first power supply line. A sixth common diffusion layer is shared by the eleventh diffusion layer and the twelfth diffusion layer. The eleventh and twelfth diffusion layers are associated with the second power supply line. A seventh common diffusion layer is shared by the thirteenth diffusion layer and the fourteenth diffusion layer. The thirteenth and fourteenth diffusion layers are associated with the first power supply line. An eighth common diffusion layer is shared by the fifteenth diffusion layer and the sixteenth diffusion layer. The fifteenth and sixteenth diffusion layers are associated with the second power supply line. A ninth common diffusion layer is shared by the seventeenth diffusion layer and the eighteenth diffusion layer. The seventeenth and eighteenth diffusion layers are associated with the third power supply line. A tenth common diffusion layer is shared by the nineteenth diffusion layer and the twentieth diffusion layer. The nineteenth and twentieth diffusion layers are associated with the fourth power supply line. An eleventh common diffusion layer is shared by the twenty-first diffusion layer and the twenty-second diffusion layer. The twenty-first and twenty-second diffusion layers are associated with the third power supply line. A twelfth common diffusion layer is shared by the twenty-third diffusion layer and the twenty-fourth diffusion layer. The twenty-third and twenty-fourth diffusion layers are associated with the fourth power supply line. A fifth signal propagates on the fifth wiring in the first direction, a seventh signal propagates on the seventh wiring in the first direction, a fourth signal propagates on the fourth wiring in the second direction, and a sixth signal propagates on the sixth wiring in the second direction.

In some cases, the semiconductor device may include, but is not limited to the first, second, third, fourth and fifth circuits in which each of the first, second, third, fourth and fifth circuits includes a field effect transistor. Each of the first, second, third, fourth, fifth, sixth, seventh and eighth diffusion layers is one of a plurality of electrodes of the field effect transistor.

In some cases, the semiconductor device may include, but is not limited to, the first, second, third and fourth circuits, in which each of the first, second, third and fourth circuits includes a field effect transistor, each of the first, second, third, fourth, fifth, sixth, seventh and eighth diffusion layers is one of a plurality of electrodes of the field effect transistor.

The semiconductor device in accordance with the present invention includes plural logic circuits which are driven by different power supplies. The different power supplies are alternately arranged to the logic circuits. The layout of the logic circuits is made for adjacent logic circuits of the logic circuits to connect to an identical power supply. A diffusion layer of a device element of one adjacent logic circuit is used in common with that of a device element of the other adjacent logic circuit, so that the common diffusion layer is connected to the identical power supply.

In this way, for the semiconductor device described above formed from logic circuits which are connected to different power supplies, a layout of the logic circuits is made to adjacently arrange the logic circuits which are connected to an identical power supply. Thus, even for the semiconductor device including logic circuits which are connected to different power supplies to form diffusion layers, the diffusion layers of the power supplies of adjacent transistors can be formed in common. In this way, not only for a semiconductor device which is configured to connect to an identical power supply, but also for the semiconductor device whose input and output terminals are alternately connected to different power supplies, the layout area of the semiconductor device can be reduced by forming common diffusion layers.

Hereinafter, embodiments of the present invention will be described in detail with reference to the drawings.

Figure 1:
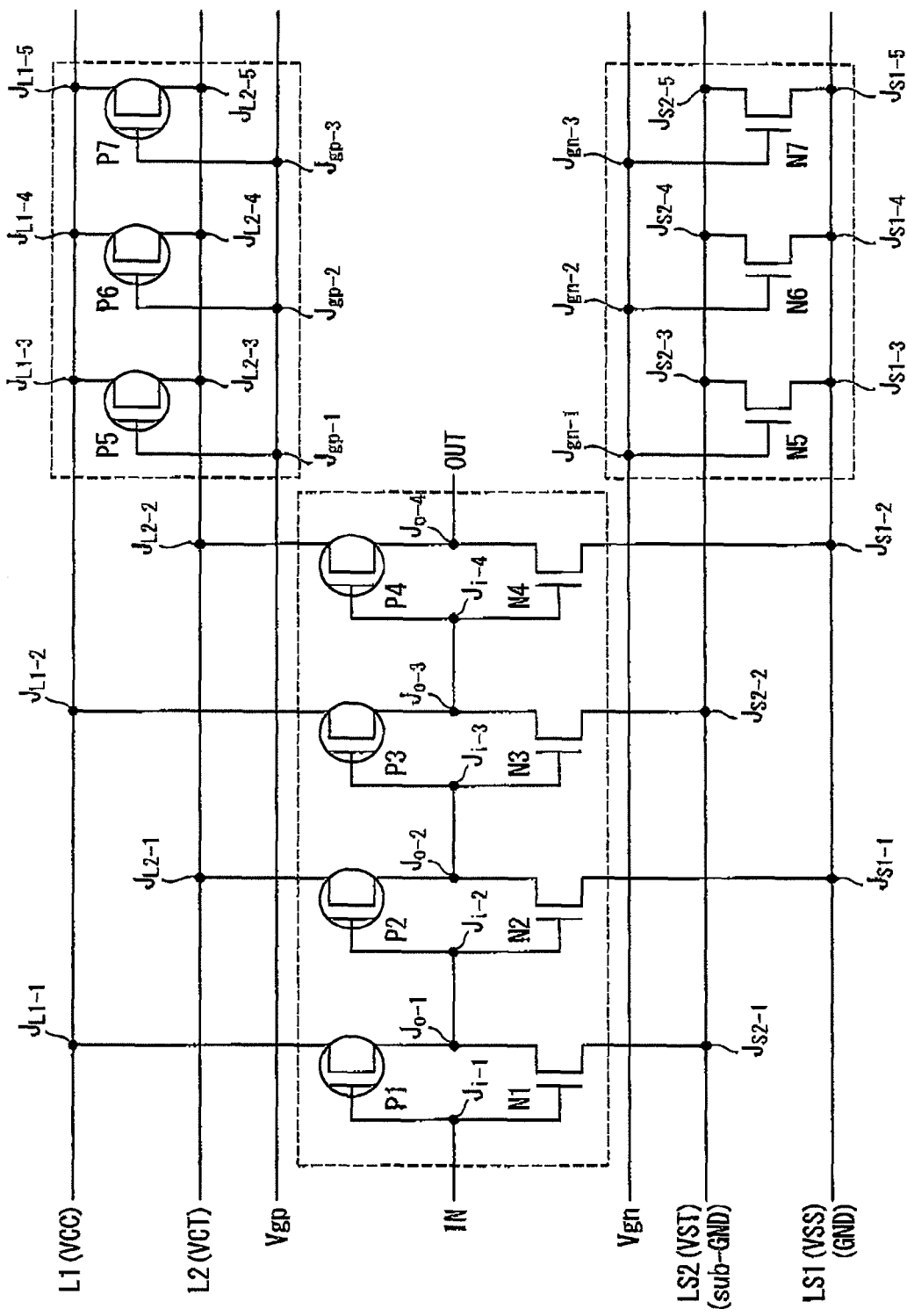
FIG. 1 is a view illustrating an example of a logic circuit provided with a current source control configuration.
Figure 2B:
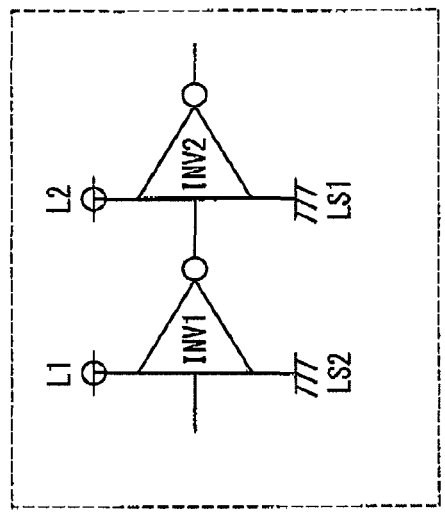
FIG. 2B is a diagram illustrating symbols of the inverter circuits of FIG. 2A.
Figure 2A:
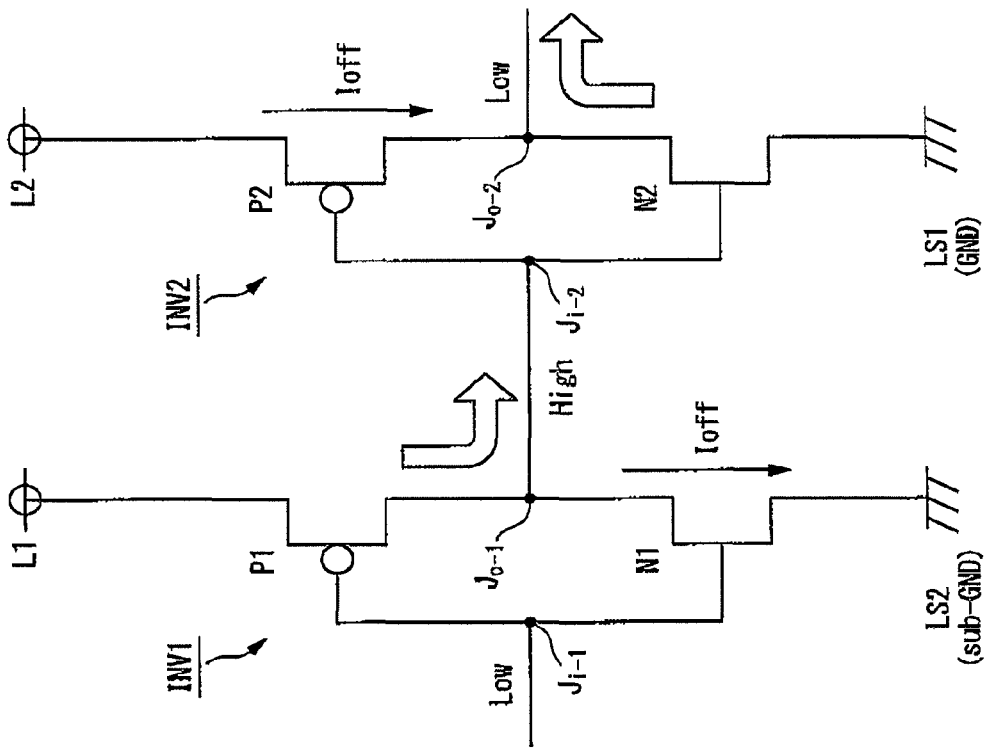
FIG. 2A is a diagram to explain operations of inverter circuits with a current source control configuration.

FIG. 1 is a view illustrating an example of a circuit having a current source control configuration. Four inverter circuits are indicated in the figure. Each of the inverter circuits includes a PMOS transistor and an NMOS transistor. Two of the four inverter circuits INV1 and INV2 are illustrated in FIG. 2A and FIG. 2B for explanations.

This circuit is configured to reduce power consumption while a semiconductor device is in standby mode. The circuit includes the four inverter circuits provided with MOS transistors. For the inverter circuit of FIG. 1, an input signal IN is transmitted through the terminal IN. The input signal IN passes through the four stages of the inverter circuits. When the inverter circuit is in standby mod; the input signal IN is set to be a low state. Further, P-MOS transistors P5, P6 and P7 are used as drivers of P channel transistors P1, P2, P3 and P4 of the inverter circuits. A voltage VCC of a power supply line L1 (power source line L1) is applied to the source electrodes of the P-MOS transistors. The voltage VCC is controlled by a control voltage Vgp applied to the gate electrodes of the P-MOS transistors P5, P6 and P7, so that a sub-source voltage VCT is supplied to a power supply line L2 connected to the drain electrodes of the P-MOS transistors (a sub-power source). N-MOS transistors N5, N6 and N7 are used as drivers of the N-MOS transistors N1, N2, N3 and N4. A ground voltage VSS is applied to the source electrodes of the N-MOS transistors N5, N6 and N7. The ground voltage VSS is controlled by a control voltage Vgn applied to the gate electrodes of the N-MOS transistors N5, N6 and N7, so that a ground voltage VST is generated at the drain electrodes of the NMOS transistors N5, N6 and N7 by the ground voltage VSS. The ground voltage VST is supplied to a ground line LS2 (sub-GND). In other words, power source lines and ground lines are arranged so that a power source line L1 supplies the power supply voltage VCC (a power supply), a ground line LS1 supplies the ground voltage VSS (GND), a power source line L2 supplies a sub-source voltage VCT, and a ground line LS2 supplies the ground voltage VST.

For the power source line L2, the drivers of the PMOS transistor become ON in normal operations, so that the voltage VCC of the power source line L1 corresponds to the voltage VCT of the power source line L2. To be accurate, the voltage VCT is lower than the voltage VCC by the voltage drop caused between the sources and the drains of the PMOS transistors P5, P6 and P7.

In standby mode, the drivers of the PMOS transistors P5, P6 and P7 become OFF, so that the power source line L2 becomes a floating state. For the ground line LS2, the drivers of the NMOS transistors N5, N6 and N7 become ON in the normal operations, so that the voltage VST of the ground line LS2 corresponds to the voltage VSS of the ground LS1. To be accurate, the voltage VST is higher than the voltage VSS by the voltage drop caused between the sources and drains of the NMOS transistors N5, N6 and N7. Further, in standby mode, the drivers of the NMOS transistors N5, N6 and N7 become OFF, so that the ground line LS2 becomes a floating state.

The input signal IN becomes a low state in standby mode. At the first stage, the PMOS transistor P1 becomes ON, and the source of the PMOS transistor P1 is connected to the power source line L1. The NMOS transistor N1 becomes OFF, and the source of the NMOS transistor N1 is connected to the ground line LS2. At the second stage, the PMOS transistor P2 becomes OFF and the source of the PMOS transistor P2 is connected to the power source line L2. The NMOS transistor N2 becomes ON, and the source of the NMOS transistor N2 is connected to the ground line LS1. At the third stage, the PMOS transistor P3 becomes ON and the source of the PMOS transistor P3 is connected to the power source line L1. The NMOS transistor N3 becomes OFF, and the source of the NMOS transistor N3 is connected to the ground line LS2. At the fourth stage, the PMOS transistor P4 becomes OFF and the source of the PMOS transistor P4 is connected to the power source line L2. The NMOS transistor N4 becomes ON, and the source of the NMOS transistor N4 is connected to the ground line LS1.

FIG. 2A is a diagram which explains the operations of an inverter circuit with the current source control configuration. The figure indicates the first inverter circuit (P1, N1) at the first stage and the second inverter circuit (P1, N2) at the second stage. FIG. 2B shows the symbols of the first and second inverter circuits indicating that the first and second inverter circuits are connected in series. For the inverter circuit with the current source control configuration in FIG. 2A, the gate of the inverter circuit INV1 is a low level in standby mode, the source of the PMOS transistor P1 is connected to the power source line L1 (primary power supply). The source of the NMOS transistor N1 is connected to the ground line LS2 (floating state). The gate of the inverter circuit INV2 is a high level in standby mode. The source of the PMOS transistor P2 is connected to the power source line L2 (floating state). The source of the NMOS transistor N2 is connected to the ground line LS2 (primary GND). In this way, the inverter circuits with the current source control configuration set the power source line L2 and the ground line LS2 to be a floating state. Thereby, a standby current Ioff, which flows between the source and the drain, is reduced. Thus, a consumption of current can be reduced.

Figure 3B:
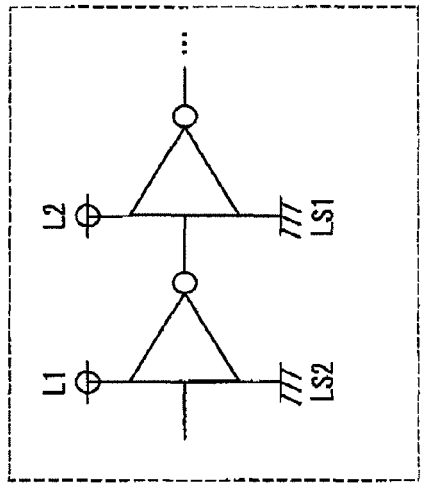
FIG. 3B is a diagram illustrating symbols of the inverter circuits (logic circuits S1 and S2) of FIG. 3A.
Figure 3A:
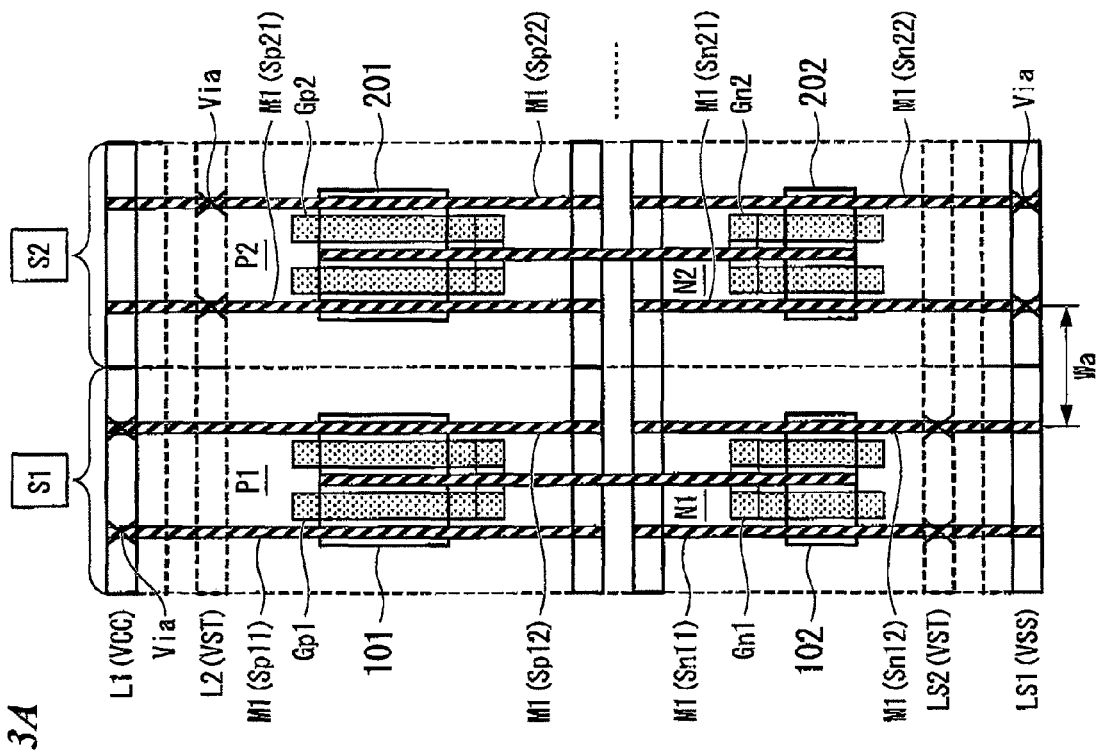
FIG. 3A is a view illustrating an example of a layout of the inverter circuits (logic circuits S1 and S2) of FIG. 2A.

FIG. 3A is a view showing an example of a layout of the inverter circuits of FIG. 2A indicated as S1 and S2. FIG. 3B illustrates symbols of the inverter circuits S1 and S2, which are connected in series. In FIG. 3A, PMOS transistors P1 and P2 are formed in diffusion layers 101 and 201, respectively. NMOS transistors N1 and N2 are formed in diffusion layers 102 and 202, respectively. A gate wiring Gp1 of the gate electrode of the PMOS transistor P1 is connected to a gate wiring Gn1 of the gate electrode of the NMOS transistor N1. A gate wiring Gp2 of the gate electrode of the PMOS transistor P2 is connected to a gate wiring Gn2 of the gate electrode of the NMOS transistor N2. A primary power supply line (voltage VCC) is connected to a power source line L1 for supplying a primary potential. A sub-power supply (voltage VCT) is connected to a power source line L2 for supplying a secondary potential. A primary ground GND (voltage VSS) is connected to a ground line LS1 for supplying a primary ground potential. A sub-ground GND (voltage VST) is connected to a ground line LS2 for supplying a sub-ground potential.

In FIG. 3A, a layout is arranged for an inverter circuit S1 (logic circuit S1) and an inverter circuit S2 (logic circuit S2) to be adjacent. The logic circuit S1 is connected to the power source line L1 and the ground line LS2. The logic circuit S2 is connected to the power source line L2 and the ground line LS1. In this case, the logic circuit S1 and the logic circuit S2 are connected to different power sources (power supply lines). Wiring layers M1 (Sp11, Sp12) are connected to the diffusion layers of the PMOS transistor P1 and to the power source line L1. Wiring layers M1 (Sp21, Sp22) are connected to the diffusion layers of the PMOS transistor P2 and to the power source line L2. Wiring layers M1 (Sn11, Sn12) are connected to the diffusion layers of the NMOS transistor N1 and to the ground line LS2. Wiring layers M1 (Sn21, Sn22) are connected to the diffusion layers of the NMOS transistor N2 and to the ground line LS1. The potential of the ground line LS1 is different from that of the ground line LS2.

In this case, no common diffusion layer can be formed between the PMOS transistor P1 of the inverter circuits S1 and the PMOS transistor P2 of the inverter circuit S2, because the power source line L1 coupled to the wiring layers M1 (Sp11, Sp12) has different electrical potential from that of the power source line L2 coupled to a wiring layers M1 (Sp21, Sp22). Likewise, no common diffusion layer can be formed between the NMOS transistor N1 of the inverter circuit S1 and the NMOS transistor N2 of the inverter circuit S2, because the ground line LS2 coupled to the wiring layer M1 (Sn11 and Sn12) has different electrical potential from that of the ground line LS1 coupled to the wiring layer M1 (Sn21 and Sn22). Thereby, the layout area (cell size) is increased by the area associated with a width Wa compared to the cell of FIG. 11B. The width Wa is indicated in the bottom of FIG. 3A.

Figure 4:
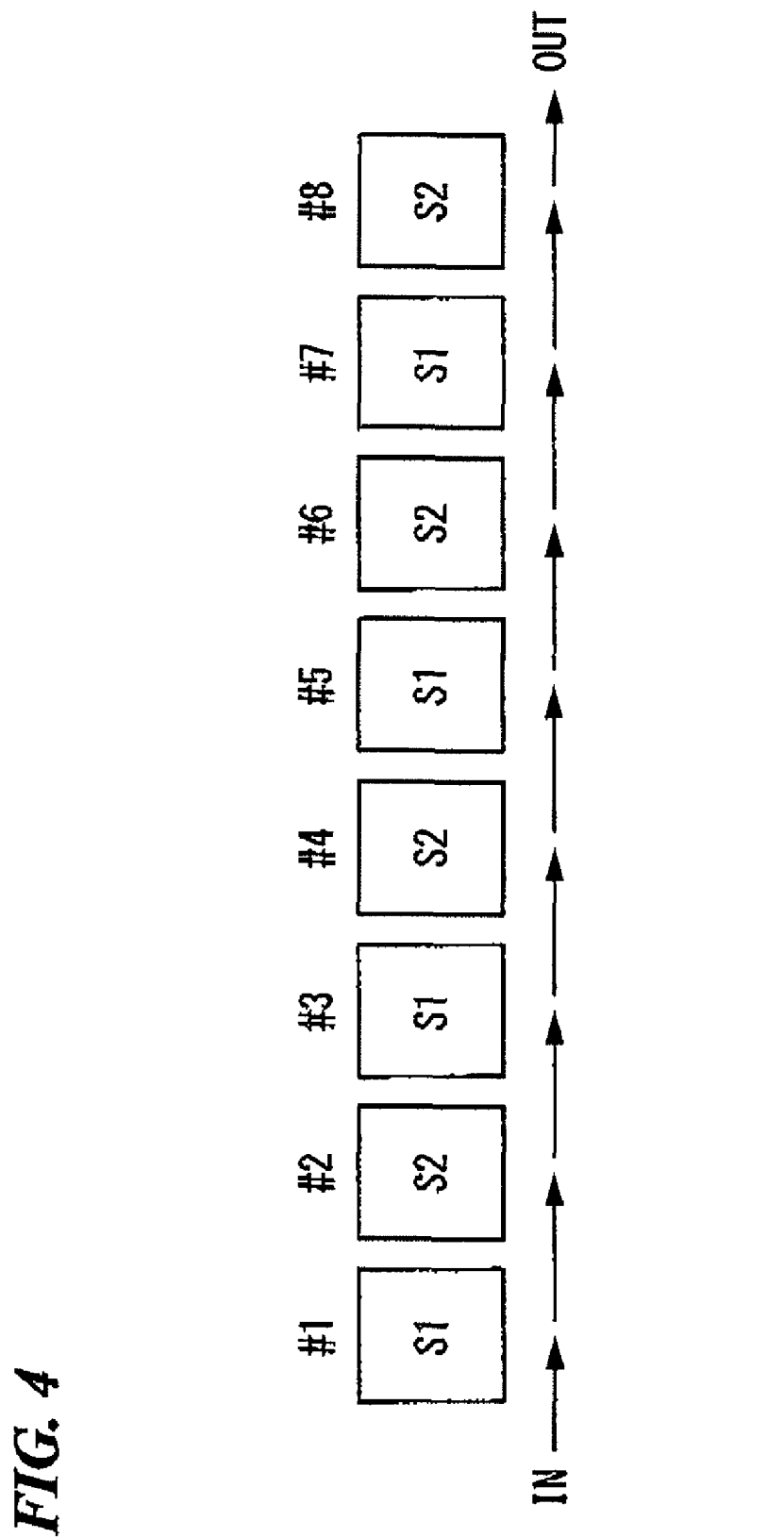
FIG. 4 is a view illustrating an example of a layout of plural logical circuits having multistage connections in series formed with current source control configurations.

Further, FIG. 4 shows an example of a layout which includes series-connected multistage logical circuits having plural current source control configurations. It illustrates eight inverter circuits indicated by symbols #1 through #8, which are connected in series. FIG. 4 indicates an example, where the inverter circuit S1 and the inverter circuit 82 are alternately arranged. In this case, the inverter circuit S1 is connected to the power source line L1 and the ground line LS2, and the inverter circuit S2 is connected to the ground line LS1 and the power source line L2. A single wiring is used to connect the eight inverters. Further, FIG. 4 shows arrows indicating signals propagating from left to right in the figure. This direction of the arrows is defined as a first direction. No common diffusion layer is formed.

In an example of the current source control configuration shown in FIGS. 3A, 3B and FIG. 4, the power source line L1 (VCC) and the power source line L2 (VST) are connected to different power sources. The power source line L1 (VCC) and the power source line L2 (VST) are alternately arranged. Further, the ground line LS1 and the ground line LS2 are connected to different power sources (different ground lines). The ground line LS1 and the ground line LS2 are alternately arranged. Thereby, when logic circuits having different power supply systems are alternately arranged for the current source control, adjacent logic circuits cannot use a common diffusion layer to be connected to a single power supply line.

In the following, descriptions will be given for explaining preferred embodiments of the present invention with reference to drawings.

First Embodiment

Figure 5A:
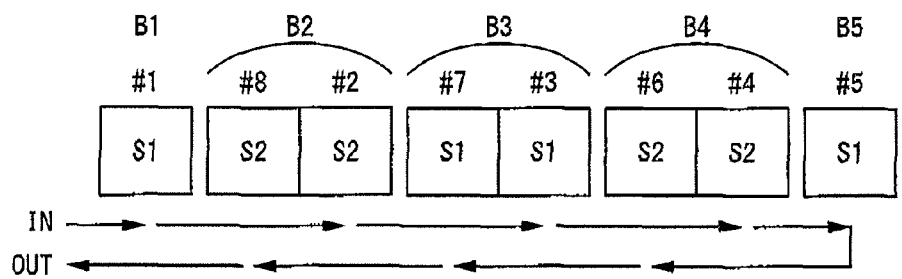
FIG. 5A is a view illustrating an arrangement of logic circuits in a semiconductor device in accordance with the first preferred embodiment of the present invention.
Figure 5B:
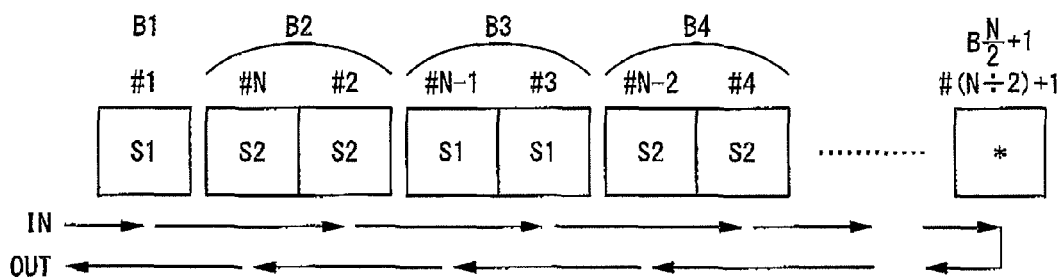
FIG. 5B is a view illustrating an arrangement of logic circuits in a semiconductor device in accordance with the first preferred embodiment of the present invention.

FIGS. 5A and 5B show arrangements of logic circuits in a semiconductor device in accordance with the first preferred embodiment of the present invention. FIGS. 5A and 5B show layouts showing arrangement orders of logical circuits, in which the input and output of the logic circuits are connected in series. The circuits of FIG. 5A and FIG. 5B include the current source control configuration. The logic circuits S1, S2 are driven by different power supply systems (different power source lines and different ground lines). FIG. 5A illustrates a layout which includes eight inverter circuits (logic circuits) connected in series. The layout indicates an arrangement order of the eight inverter circuits. The eight inverter circuits use different power source lines. FIG. 5B illustrates a layout which includes N (N indicating even number) of inverter circuits (logic circuits) connected in series. The layout indicates an arrangement order of N of inverter circuits. N of the inverter circuits use different power source lines. FIG. 5A and FIG. 5B are used to explain how the power source lines and ground lines GND are connected to the inverter circuits. It is assumed that first logic circuits each is connected to the power source line L1 and the ground line LS2. A first logic circuit is referred to as "S1." Second logic circuits each is connected to the power source L2 and the ground line LS1. A second logic circuit is referred to as "S2." Further, FIGS. 5A and 5B show the arrangement orders of logic circuits S1 and S2 and signal connection orders between the inverter circuits.

FIG. 5A illustrates blocks B1 through B5 of inverter circuits connected in series, in which eight inverter circuits, inverter circuit S1 (#1, #3, #5, #7) and inverter circuit S2 (#2, #4, #6, #8), are included in the blocks B1 through B5. The block B1 includes an inverter S2 (#1). The block B5 includes an inverter circuit S1(#5). The block B2 includes two logic circuits S2 (#8, #2). The block B3 includes two inverter circuits S1 (#7, #3). The block B4 includes two inverter circuits S2 (#6, #4). The two logic circuits (S2, S2) of the block B2, the two logic circuits (S1, S1) and the two logic circuits (S2, S2) of the block B3 are arranged between the first stage (block B1) and the end stage (block B5). For an example, FIG. 5A shows that the blocks B1 through B5 correspond to an arrangement order of "S1", "S2, S2", "S1, S1", "S2, S2", and "S1" from the left to the right in the figure. In this case, numbers #1 through #8 indicate the order of wiring connections between the input terminal of each of the inverter circuit S1 and the output terminal of each of the inverter circuits S2 or connections between the output terminal of each of the inverter circuits S1 and the input terminal of each of the inverter circuits S2. Also, the numbers #1 through #8 indicate the order of signal propagation between the inverter circuits. As the blocks B2 and B4 each includes two of the inverter circuits S2 which use an identical power supply system (line), each of the block B2 and B4 can use a common source wiring which is coupled to a common diffusion layer. Likewise, the block B3 uses a common source wiring which is coupled to a common diffusion layer. Therefore, FIG. 5A indicates that three of the source wirings are commonly used and two internal connection wirings are used to connect through the inverters #1 through #8. When supposing that a direction of signal propagation from the block B1 (IN) to the block B5 corresponding to a first signal path is a first signal direction, the direction of signal propagation from the block B5 to the block B1 (OUT) corresponding to a second signal path is defined to be a second signal direction which is opposite to the first signal direction. In the example of FIG. 5A, the first signal path and the second signal path form a single signal path via the block B5 (an inverter circuit). Each of the source wirings of the blocks B2, B3 and B4 is coupled to each common diffusion layer.

Figure 6:
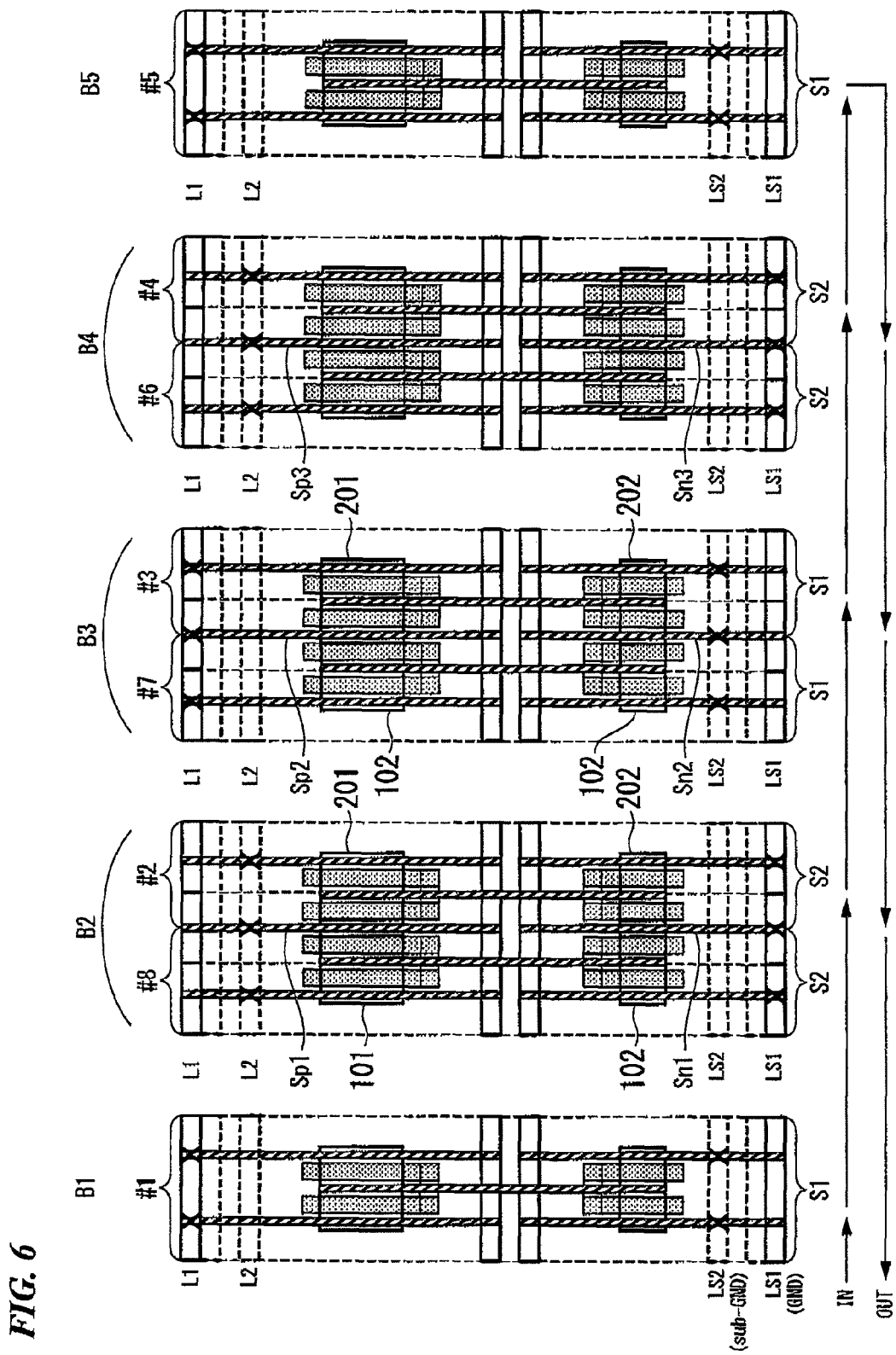
FIG. 6 is a view illustrating an example of a layout of inverter circuits in a semiconductor device of FIG. 5A.

FIG. 6 is a view illustrating an example of a layout of the inverter circuits (logic circuits) of FIG. 5A. FIG. 6 shows that the block B1 includes the logic circuit S1 (#1) which is driven between a first power supply line L1 and a second power supply line LS2 (a ground line LS2). The block B2 includes two logic circuits S2(#8), S2(#2) which are adjacent. The logic circuits S2 (#8), S2(#2) are driven between a third power supply line L2 and a fourth power supply line LS1 (a ground line LS1). The block B3 includes two logic circuits S1(#7) and S1(#3) which are adjacent. The logic circuits S1 (#7) and S1(#3) are drive between the first power supply line L1 and the second power supply line LS2. The block B4 includes two logic circuits S2(#6) and S2(#4) which are adjacent and driven between the third power supply line L2 and the fourth power supply line LS1. The block B5 includes a logic circuit S1 (#5) and are the first power supply line L1 and the second power supply line LS2. In the figure, each of the logic circuits is formed of MOS transistors. Each of the MOS transistors includes a diffusion layer which is connected to a corresponding power supply (source line). When two identical logic circuits of a block are connected to an identical power source line, a common diffusion layer can be shard by adjacent MOS transistors of the two identical logic circuits. In this way, a layout of the MOS transistors having a common diffusion layer can be designed. The common diffusion layer can be used as long as the adjacent MOS transistors (adjacent device elements) use an identical power source line.

For example, the block B2 includes two logic circuits "S2 (#8), S2(#2)." A diffusion layer 101 and a diffusion layer 201 of the logic circuits "S2 (#8), S2(#2)" are each connected to the power source line L2 through source wiring layers Sp1. In this case, an adjacent part of the diffusion layers 101 and 201 is commonly used as a common diffusion layer (not indicated in the figure) which is connected to the power source line L2 through one of the source wiring layers Sp1. For a diffusion layer 102 and a diffusion layer 202 connected to the ground line LS1, an adjacent part of the diffusion layer 102 and the diffusion layer 202 is used as a common diffusion layer (not indicated in the figure) which is connected to the ground line LS1 through one of source wiring layers Sn1.

Likewise, the block B3 includes adjacent two logic circuits "S1(#7), S1(#3)." The adjacent part of the diffusion layers 102 and 201 is commonly used as a common diffusion layer and connected to the power source line L1 through one of the source wiring layers Sp2. Another adjacent part of the diffusion layers 102 and 202 is commonly used as a common diffusion layer and connected to the ground line LS2 through the one of the source wiring layers Sn2. For the block B4, the adjacent part of the diffusion layers of two logic circuits "S2(S#6), S2(#4)" is commonly used as a common diffusion layer and connected to the power source line L2 through one of the source wiring layers Sp3. The other adjacent part of the logic circuits "S2(S#6), S2(#4)" is commonly used as a common diffusion layer and connected to the ground line LS1 through the one of the source wiring layers Sn3.

As described above, each of the three blocks B2, B3 and B4 includes two adjacent logic circuits. Thus, the power wiring layers (source wiring layer) to be commonly used become three portions in total.

For the adjacent inverter circuits S2 (#8) and S2 (#2), a common diffusion layer of the PMOS transistors is connected to the power source line L2 through the source wiring layer Sp1 and a via (part indicated with symbols x in FIG. 6). Further, the diffusion layer of the NMOS transistors is connected to the ground line LS1 through the source wiring layer Sn1 and a via.

For the adjacent inverter circuits S1 (#7) and S1 (#3), a common diffusion layer of the PMOS transistors is connected to the power source line L1 through one of the source wiring layers Sp2 and a via. Further, the common diffusion layer of the NMOS transistors is connected to the ground line LS2 through one of the source wiring layers Sn2 and a via.

Further descriptions will be given in detail for the connections of each of the logic circuits (inverter circuits) with reference to the layout of FIG. 6. In the series-connected inverter circuits shown in FIG. 5A, the input terminal of the inverter circuit S1 (#1) is connected to an output terminal of another outside circuit which is not shown in FIG. 5A.

The output terminal of the inverter circuit (#1) is connected to an input terminal of the inverter circuit S2 (#2). The output terminal and the input terminal of each of the inverter circuits S1 (#3), S2 (#4), and S1 (#5) are successively connected one another. Further, the connection of the wirings is turned back toward the inverter circuit S1 (#1) at the inverter circuit S1 (#5) of the block B5, which is arranged in the end of the series of the inverter circuits. Then, the output terminal of the inverter circuit S1 (#5) is connected to the input terminal of the inverter circuit S2 (#6). Similarly, each of the input terminals and each of the output terminals of the inverter circuit S2 (#6), the inverter circuit S1 (#7), and the inverter circuit S2 (#8) is connected each other. In this way, the wiring includes two parts for connecting between each of the input terminals and each of the output terminals of the inverter circuits. First one part is the area which is used to connect the output terminals and the input terminals of the inverter circuits from the inverter circuit S1 (#1) through the inverter circuit S1 (#5). Second one part is the area which is used to connect the output terminals and the input terminals of the inverter circuits from the inverter circuit S1 (#5) through the inverter circuit S2 (#8).

FIG. 5B illustrates a layout of logic circuits having the current source control configuration. This indicates that "N/2−1" of source lines can be commonly used, and two internal connection wirings are used in the plural logic circuits. The layout includes the logic circuits provided with series N connections (N: even number). This shows an arrangement of each of the logic circuits. The connections start from the left to the right in the figure, i.e., from the inverter circuit S1 (#1) to the inverter circuit S2 (#N) via the inverter circuit (#(N/2)+1) according to a predetermined arrangement rule. In this case, the diffusion layer connected to an identical power supply line is used in common to the adjacent inverter circuits. Further, wiring connections between the inverter circuits are made from the inverter circuit S1 (#1) to the inverter circuit S2 (#N) via the block B(N/2+1). Each of the output terminals and each of the input terminals are connected in order of the number #. Similar to the case of FIG. 5A, FIG. 5B shows that the signal connections are made at intervals of a single inverter circuit. The wiring connection is turned back toward the inverter circuit S1 (#N) at the inverter circuit S1 (#(N/2+1)) which is arranged in the end of the series of the inverter circuits. Then, the wiring connection is continued up to the inverter circuit S2 (#N) at intervals of a single inverter circuit. Similar to the case of FIG. 5A, the logic circuits (inverter circuits) are connected using two of a wiring area.

The wiring connection is made from the inverter circuit S1 (#1) of the first stage to the end of the arranged inverter circuits via the input terminal or the output terminal of one of the logic circuits in the block. In this case, the position of the end of the inverter circuits corresponds to a position where the wiring connection is turned back toward the inverter circuit S1 (#1). The wiring connection is further continued from the end of the inverter circuits to the inverter circuit (#1) using the input terminal or the output terminal of the unused inverter circuit in the block. Thus, the wiring forming a signal path is made by bypassing other logic circuits included in the same block.

As described above, the inverter circuits S1 and S2 are arranged in a semiconductor device according to the predetermined arrangement rule which indicates the arrangement order. For the PMOS transistors of adjacent inverter circuits and the NMOS transistors of adjacent inverter circuits, the common diffusion layers (source wiring layers) can be used in common to the adjacent PMOS transistors and the adjacent NMOS transistors. Thereby, the cell size of the semiconductor device can be reduced by the common diffusion layers. In this case, the way of wiring connection is independent on the number (#N) of the circuits. Further, only a single wiring needs to add to a circuit which is configured to use an identical power supply system. The single wiring is formed to connect between each of the input terminals and each of the output terminals of the inverter circuits (logic circuits). Thereby, the common diffusion layer of adjacent MOS transistors in a block can be used in common, so that the layout area of the circuits can be reduced compared to the normal power supply system which uses an identical power supply.

Furthermore, the wirings of the primary and sub-power supply systems are formed to align with the common diffusion layers, in which the alignment is made in a plan view of the top of the semiconductor device. By introducing this method, the layout area can be further reduced, because the area reduction is made for not only the lateral width of the cell but also their vertical width of the cell.

In the examples of the layout arrangements of the cells shown in FIGS. 5A and 5B, the first "logic circuit S1" is used as the first logic circuit (#1). However, the "logic circuit S2" may be used as the first logic circuit (#1) instead. And the block B2 may start with the logic circuits "S1, S1."

As described above, according to the present embodiment, plural logic circuits are alternately connected to each other through the input terminals and the output terminals of the logic circuits. In this case, the logic circuits are driven by different power supply systems, which include primary power source line and sub- and plural ground lines. The different power supply systems may include a primary power source line, a sub-power source line, a primary ground line and a sub-ground line. The use of the different power supply systems in a semiconductor device may be referred to as the current source control configuration. The logic circuits form blocks, and the logic circuits included in an identical block are driven by an identical power supply. Each block includes such logic circuits being driven by an identical power supply. If a first diffusion layer of a MOS transistor of one logic circuit in a block is adjacent to a second diffusion layer of another MOS transistor of another logic circuit in the block, a common diffusion layer can be formed for the first diffusion layer and the second diffusion layer in the layout design of the logic circuits. The common diffusion layer coupled to the power supply (primary power supply, sub-power supply, GND, sub-GND) can be used in common for the logic circuits in a block. In this way, the area to be used to form the number of the diffusion layers is reduced, and the area to be used to form adjacent diffusion layers of the inverter circuits INV1 and INV2 can be reduced. Thus, the total layout area of the whole circuit can be reduced. Furthermore, the current source control configuration is employed for the circuits according to the present embodiment. The current consumption of the circuits in standby mode can be reduced.

The circuit of FIG. 5A outputs an output signal OUT in response to the input signal IN. The output signal OUT has the same logic output as the input signal IN. A function of this circuit can be a buffer.

Unlike the case of FIG. 5A, the inverter circuit S1 (#1) may be eliminated. In this case, the wiring connection is made from the inverter circuit S2 (#2), and turned back at the inverter circuit S2 (#5) to the inverter circuit S2 (#8) by sequentially connecting each of the input terminals of the inverter circuits and each of the output terminals of the inverter circuits with intervals. Thereby, another example of a circuit according to the present embodiment may be arranged so as to output an inverse logic output as the output signal OUT for the input signal IN.

Figure 5C:
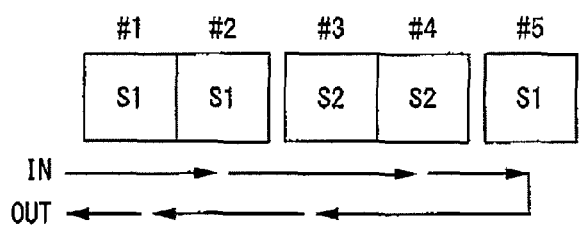
FIG. 5C is a view illustrating an arrangement of logic circuits in a semiconductor device in accordance with the first preferred embodiment of the present invention.

FIG. 5C is a view illustrating another example of the layout of the inverter circuits (logic circuits), in which three inverter circuits S1 (#1, #2, #5) and two inverter circuits S2 (#3, #4) are connected in series. The inverter circuits S1 (#1, #2, #5) and the inverter circuits S2 (#3, #4) are driven by different power supply systems (lines). For example, the inverter circuits S1 (#1, #2, #5) are driven between the first power supply line having the first electrical potential and the second power supply line having the second electrical potential. The inverter circuits S2 (#3, #4) are driven between the third power supply line having the third electrical potential and the fourth power supply line having the fourth electrical potential. In this case, an output terminal of the inverter circuit #2 is connected through a first wiring to an input terminal of the inverter circuit #4. An output terminal of the inverter circuit #4 is connected through a second wiring to an input terminal of the inverter circuit #5. An output terminal of the inverter circuit #5 is connected through a third wiring to an input terminal of the inverter circuit #3. An output terminal of the inverter circuit #3 is connected through a four wiring to an input terminal of the inverter circuit #1. Further, an input terminal of the inverter circuit #2 receives an input signal (IN). An output terminal of the inverter circuit #1 outputs an output signal (OUT). As shown in FIG. 5C, the first, second, third, fourth and fifth circuits are disposed in series in the first direction. In the same manner as FIGS. 5A and 5B, the first circuit includes a first diffusion layer and a third diffusion layer. The second circuit includes a second diffusion layer and a fourth diffusion layer. The third circuit includes a fifth diffusion layer and a seventh diffusion layer. The fourth circuit includes a sixth diffusion layer and an eighth diffusion layer. For the inverter circuits #1 and #2, a first common diffusion layer is shared by the first diffusion layer and the second diffusion layer, and the first and second diffusion layers are associated with the first power supply line. Further, a second common diffusion layer is shared by the third diffusion layer and the fourth diffusion layer. The third and fourth diffusion layers are associated with the second power supply line.

In the present embodiment, plural logic circuits (inverter circuits) are alternately connected to different power sources (power source line L1, power source line L2, ground line LS1, ground line LS2). When the logic circuits connected to an identical power supply are adjacently arranged in a layout and diffusion layers are to be connected to the identical power supply. The diffusion layers are formed between adjacent device elements of the adjacent logic circuits. Then a common diffusion layer can be formed for the diffusion layers of the adjacent device elements.

Second Embodiment

Figure 7A:
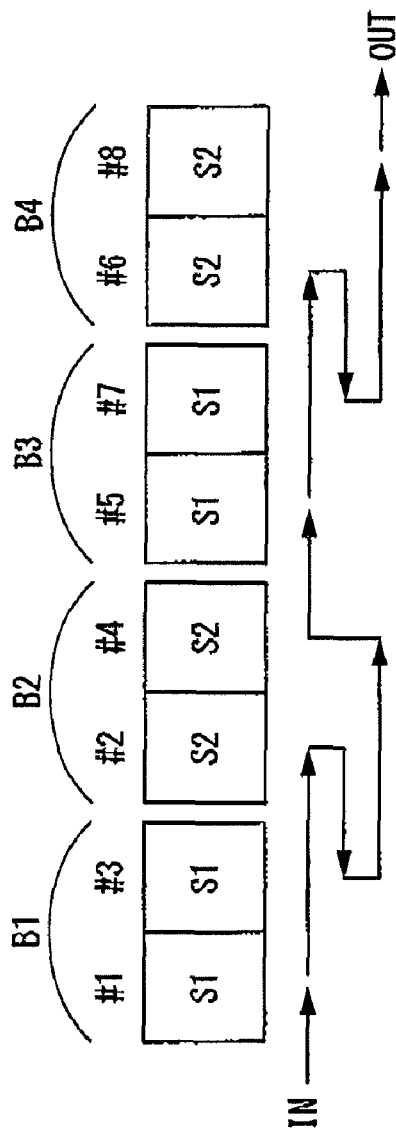
FIG. 7A is a view illustrating an arrangement order of logic circuits in a semiconductor device in accordance with the second embodiment of the present invention.
Figure 7B:
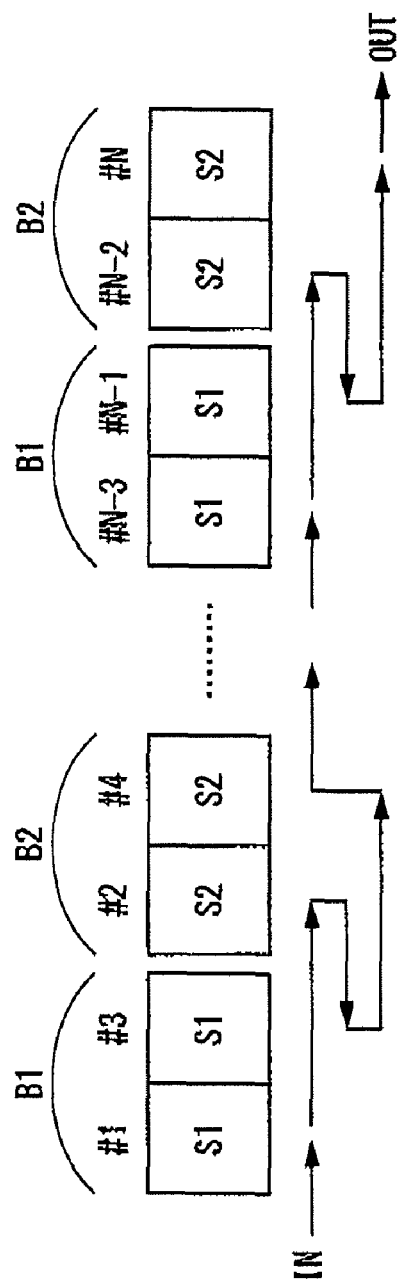
FIG. 7B is a view illustrating an arrangement order of logic circuits in a semiconductor device in accordance with the second embodiment of the present invention.

FIGS. 7A and 7B are views illustrating the examples of the arrangement order of inverter circuits in semiconductor devices in accordance with the second embodiment of the present invention. FIG. 7A illustrates series-connected eight inverter circuits arranged in a layout. The current source control configuration is employed for the eight inverter circuits. FIG. 7B illustrates series-connected N-inverter circuits (logic circuits) arranged in a layout. The current source control configuration is employed for the series-connected N-inverter circuits.

In FIG. 7A, the eight inverter circuits include first inverter circuits S1 (#1, #3, #5, #7) in a block B1 and a block B3 and second inverter circuits S2 (#2, #4, #6, #8) in a block B2 and a block B4, which are connected in series. From the left to the right in the figure, two of the first logic circuit S1 ("S1, S1") are arranged in a first block B1, and two of the second logic circuits ("S2, S2") are arranged in a fourth block B4 in the end of the series circuit. The second block B2 and the third block B3 are arranged between the first block E1 and the fourth block B4. The second block B2 includes two logic circuits ("S2, S2"). The third block B3 includes two logic circuits ("S1, S1"). In the example of FIG. 7A, the four blocks are arranged in order of "S1, S1", "S2, S2", "S1, S1", and "S2, S2" from the left side of the figure to the right side in the figure. Thus, each of the four blocks includes two logic circuits being adjacent. Each of the four blocks includes a diffusion layer which is connected to power supply lines. In this example, it is assumed that the two logic circuits in the same block include a common diffusion layer which is common to adjacent logic circuits. For example, a first common diffusion layer is formed between the inverter circuit S1 (#1) and the inverter circuit S1 (#3) in the first block B1. In the same manner, the blocks B2, B3 and B4 include common diffusion layers. Then, four common diffusion layers (source diffusion layers) are formed in total in the four blocks B1, B2, B3 and B4. In this case, the block B1 and the block B3 are connected to a first identical power supply line. The block B2 and the block B4 are connected to a second identical power supply line.

Further, descriptions will be given for the connection rule of each of the logic circuits (inverter circuits) with reference to a layout of FIG. 7A. For the series-connected eight inverter circuits of FIG. 7A, the input terminal of the inverter circuit S1 (#1) is connected to an output terminal of another circuit. The output terminal of the inverter circuit S1 (#1) is connected to the input terminal of the inverter circuit S2 (#2). In the same manner, the wiring connections are made between each of the output terminals of the inverter circuits and each of the input terminals of the inverter circuits as indicated with the arrows in FIG. 7A. The wiring connections are made for the inverter circuit S1 (#3), the inverter circuit S2 (#4), the inverter circuit S1 (#5), the inverter circuit S2 (#6), the inverter circuit S1 (#7), and the inverter circuit S2 (#8) in order. In this case, the inverter circuits S1 and the inverter circuits S2 are connected to different power sources. The inverter circuits S1 are arranged in blocks B1 and the inverter circuits S2 are arranged in blocks B2 blocks. The wiring connections are made alternately between the blocks B1 and B2. In this case, after connecting the output terminal of the inverter circuit S1 (#1) to the input terminal of the inverter circuit S2 (#2), the wiring is turned back to the reverse direction to connect to the input terminal of the inverter circuit S1 (#3). Thus, additional wiring layers are provided for timing back the wiring direction in accordance with the present embodiment. Thereby, the wiring area of three wirings is provided for connecting between the input terminals and the output terminals of the inverter circuits. In this case, each of the blocks B1, B2, B3 and B4 includes one common diffusion layer, so that four common diffusion layers are used in total for the eight inverter circuits.

FIG. 7B shows that N (N: even number) of inverter circuits having the current source control configuration are arranged in a layout. In the example of FIG. 7B, a first block B1 and an end block B2 are arranged. The first block B1 includes two of the first logic circuits S1 ("S1, S1"). The end block B2 includes two of the second logic circuits S2 ("S2, S2"). Each of the second blocks B1 includes two of the first logic circuits ("S1, S1"). Each of the second blocks B2 includes two of the second logic circuits ("S2, S2"). From the left to the right in the figure, a first block B1 is arranged in the left, and a second block B2 is arranged in the right end. Other second blocks B2 and other first blocks B1 are alternately arranged between the first block B1 (left end) and the second block B2 (right end).

In the figure, the connections of logic circuit cells are made from the left to the right in order, the inverter circuit S1 (#1), the inverter circuit S2 (#2), the inverter circuit S1 (#3), the inverter circuit S2 (#4), ..., the inverter circuit S1 (#N−3), the inverter circuit S2 (#N−2), the inverter circuit S1 (#N−1) and the inverter circuit S2 (#N) according to a predetermined arrangement rule. In this case, each of the common diffusion layers (source diffusion layers) is in common for the diffusion layers of the adjacent inverter circuits connected to an identical power supply.

The wiring connection between an output terminal and an input terminal of the inverter circuits is made with reference to the arrows indicated in FIG. 7B. The output terminal of the inverter circuit S1 (#1) is connected to the input terminal of the inverter circuit S2 (#2) first, and then the wiring is turned back to the reverse direction at the inverter circuit S2 (#2). Further, the output terminal of the inverter circuit S2 (#2) is connected to the input terminal of the inverter circuit S1 (#3). In the same manner, the output terminal of the inverter circuit S1 (#N−3) is connected to the input terminal of the inverter circuit S2 (#N−2). Then the wiring is turned back to the reverse direction at the inverter circuit S2 (#N−2). Further, the output terminal of the inverter circuit S2 (#N−2) is connected to the input terminal of the inverter circuit S1 (#N−1), the output terminal of the inverter circuit S1 (#N−1) is connected to the input terminal of the inverter circuit S2 (#N).

The examples of FIGS. 7A and 7B show an increase in the number of the common diffusion layers (source diffusion layers). The common diffusion layers of the identical blocks are connected to an identical power supply. In this case, three of the wirings are used for transmission of signals through the logic circuits.

In the examples of the layout arrangements of the logic circuits shown in FIGS. 7A and 7B, the "logic circuit S1" is used as the first input circuit referred to as the first logic circuit (#1). However, the "logic circuit S2" may be used as the first input circuit referred to as the first logic circuit (#1) instead.

Third Embodiment

Figure 8A:
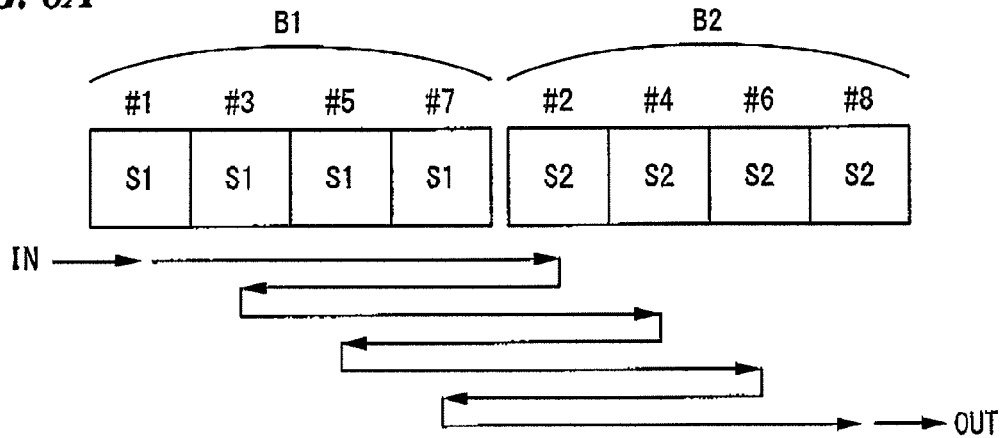
FIG. 8A is a view illustrating an arrangement order of logic circuits in a semiconductor device in accordance with the third embodiment of the present invention.

FIG. 8A is a view illustrating an arrangement order of logic circuits in a semiconductor device in accordance with the third embodiment of the present invention. The arrangement order of logic circuits will define a layout of series-connected eight inverter circuits (logic circuits). The current source control configuration is employed for the series-connected eight inverter circuits.

FIG. 8A illustrates eight inverter circuits in total, in which a first block B1 includes four inverter circuits S1 (#1, #3, #5, #7) as a first stage and a second block B2 includes four inverter circuits S2 (#2, #4, #6, #8) as a second stage. The eight inverter circuits are connected in series.

The block B1 includes four adjacent logic circuits "S1(#1), S1(#3), S1(#5), S1(#7)". Common diffusion layers of adjacent inverter circuits in the block B1 can be used in common to be connected to the power source L1. The other common diffusion layers of adjacent inverter circuits in the block B1 can be used in common to be connected to the ground line LS2. Likewise, the block B2 include four adjacent logic circuits S2 ("S2(#2), S2(#4), S2(#6), S2(#8)"). Common diffusion layers of the inverter circuits in the block B2 can be used in common to be connected to the power source L2. The other diffusion layers of the inverter circuits in the block B2 can be used in common to be connected to the ground line LS1. As the block B1 includes four adjacent logic circuits, there are three common diffusion layers in the block B1. For the block B1, the first one of the three common diffusion layers is formed between the inverter circuits S1(#1) and S1(#3). The second one of the three common diffusion layers is formed between the inverter circuits S1(#3) and S1(#5). The third one of the three common diffusion layers is formed between the inverter circuits S1(#5) and S1(#7). Likewise, the lock B2 includes three common diffusion layers. In the block B2, the first one of the three common diffusion layers is formed between the inverter circuits S2(#2) and S2(#4). The second one of the three common diffusion layers is formed between the inverter circuits S2(#4) and S2(#6). The third one of the three common diffusion layers is formed between the inverter circuits S2(#6) and S2(#8). Thus, there are six common diffusion layers in total in the blocks B1 and B2.

For the connection order of signals through the logic circuits, the output terminal of the inverter circuit S1 (#1) in the block B1 is connected to the input terminal of the inverter circuit S2 (#2) in the block B2. The wiring is turned back to the reverse direction at the inverter circuit S2 (#2). The output terminal of the inverter circuit S2 (#2) is connected to the input terminal of the inverter circuit S1 (#3) in the block B1. The output terminal of the inverter circuit S1 (#3) is connected to the input terminal of the inverter circuit S2 (#4) in the block B2. In the same manner, the wiring connections are repeated, so that the whole logic circuits in each block are connected for signal transmission. Thus, a wiring area of seven wirings is used to connect each of the inverter circuits.

In the same manner, when the number of N (N; even number) of the logic circuits are arranged in the same block in a layout, the number of N−2 of common diffusion layers can be used in common to be connect to an identical power supply. A wiring area of N−1 wirings is used to connect each of the whole inverter circuits. In the example of the arrangement order shown in FIG. 8A, the area used by the wirings for connecting each of the inverter circuits is increased.

In the examples of the layout arrangements of the logic circuits shown in FIG. 8A, although the "logic circuit S1" is used for the first input circuit as a first logic circuit (#1), the "logic circuit S2" may be used for the first input circuit as the first logic circuit (#1) instead.

Figure 8B:
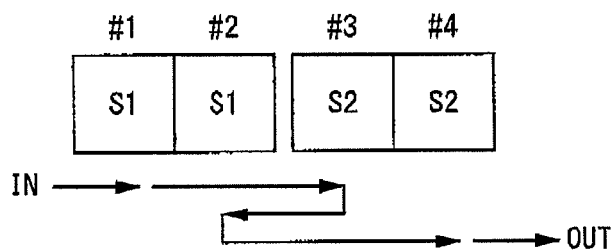
FIG. 8B is a view illustrating an arrangement order of logic circuits in a semiconductor device in accordance with the third embodiment of the present invention.

For another example of the circuit layout, FIG. 8B shows four logic circuits "S1(#1), S1(#2)" and "S2(#3), S2(#4)." In this case, each of the first circuit S1(#1) and the second circuit S1(#2) is driven between a first power supply line (a power source line L1) having a first electrical potential and a second power supply line (a ground line LS2) having a second electrical potential. The first electrical potential is higher than the second electrical potential. The first circuit S1(#1) includes a first diffusion layer and a third diffusion layer, the second circuit S1(#2) includes a second diffusion layer and a fourth diffusion layer. Further, each of the third circuit S2(#3) and the fourth circuit S2(#4) is driven between a third power supply line having a third electrical potential and a fourth power supply line having a, fourth electrical potential. The third electrical potential is higher than the fourth electrical potential. The third circuit S2(#3) includes a fifth diffusion layer and a seventh diffusion layer. The fourth circuit S2(#4) includes a sixth diffusion layer and an eighth diffusion layer. In this cases, a first output terminal of the first circuit S1(#1) is connected through a first wiring to a third input terminal of the third circuit S2(#3). A third output terminal of the third circuit S2(#3) is connected through a second wiring to a second input terminal of the second circuit S1(#2). A second output terminal of the second circuit S1(#2) is connected through a third wiring to a fourth input terminal of the fourth circuit S2(#4). A first input terminal of the first circuit S1(#1) receives an input signal IN. A fourth output terminal of the fourth circuit S2(#4) outputs a first output signal OUT. The first, second, third, and fourth circuits "S1(#1), S1(#2)", "S2(#3), S2(#4)" are disposed in series in a first direction. A first common diffusion layer is shared by the first diffusion layer of the first circuit S1(#1) and the second diffusion layer of the second circuit S1(#2). The first and second diffusion layers are associated with the first power supply line. A second common diffusion layer is shared by the third diffusion layer of the first circuit S1(#1) and the fourth diffusion layer of the second circuit S1(#2), and the third and fourth diffusion layers are associated with the second power supply line. Furthermore, a third common diffusion layer is shared by the fifth diffusion layer of the third circuit S2(#3) and the sixth diffusion layer of the fourth circuit S2(#4). The fifth and sixth diffusion layers are associated with the third power supply line. A fourth common diffusion layer is shared by the seventh diffusion layer of the third circuit S2(#3) and the eighth diffusion layer of the fourth circuit S2(#4). The seventh and eighth diffusion layers are associated with the fourth power supply line. A first signal propagates on the first wiring in the first direction. A third signal propagates on the third wiring in the first direction, and a second signal propagates on the second wiring in a second direction being opposite to the first direction.

Figure 8C:
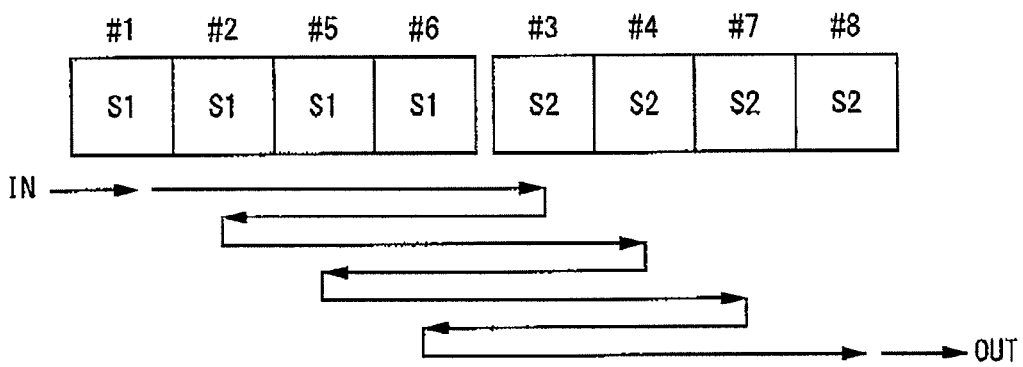
FIG. 8C is a view illustrating an arrangement order of logic circuits in a semiconductor device in accordance with the third embodiment of the present invention.

FIG. 8C is an illustration of another modified example of the layout from that is shown in FIG. 83. In this case, a fifth circuit S1(#5) and a sixth circuit S1(#6) are disposed on the right side of the second circuit S1(#2). A seventh circuit S2(#7) and an eighth circuit S2 (#8) are disposed on the right side of the fourth circuit S2(#4). In this case, each of the fifth circuit S1(#5) and the sixth circuit S1(#6) is driven between the first power supply line and the second power supply line. The fifth circuit S1(#5) includes a tenth diffusion layer, a twelfth diffusion layer, a thirteenth diffusion layer and a fifteenth diffusion layer. The sixth circuit S1(#6) includes a fourteenth diffusion layer and a sixteenth diffusion layer. Each of the seventh circuit S2(#7) and the eighth circuit S2(#8) is driven between the third power supply line and the fourth power supply line. The first, second, fifth, sixth, third, fourth, seventh and eighth circuits are disposed in series in the first direction. The seventh circuit S2(#7) includes an eighteenth diffusion layer, a twentieth diffusion layer, a twenty-first diffusion layer and a twenty-third diffusion layer. The eighth circuit S2(#8) includes a twenty-second diffusion layer and a twenty-fourth diffusion layer. Further, the second circuit S1(#2) includes a ninth diffusion layer and an eleventh diffusion layer. The fourth circuit S2(#4) includes a seventeenth diffusion layer and a nineteenth diffusion layer. As indicated in FIG. 8C, the fourth output terminal of the fourth circuit S2(#4) is connected through a fourth wiring to a fifth input terminal of the fifth circuit S1(#5), and a fifth output terminal of the fifth circuit S1(#5) is connected through a fifth wiring to a seventh input terminal of the seventh circuit S2(#7). A seventh output terminal of the seventh circuit S2(#7) is connected through a sixth wiring to a sixth input terminal of the sixth circuit S1(#6), and a sixth output terminal of the sixth circuit S1(#6) is connected through a seventh wiring to an eighth input terminal of the eighth circuit S2(#8). An eighth output terminal of the eighth circuit S2(#8) outputs a second output signal (OUT). In this case, a fifth common diffusion layer is shared by the ninth diffusion layer and the tenth diffusion layer, and the ninth and tenth diffusion layers are associated with the first power supply line. A sixth common diffusion layer is shared by the eleventh diffusion layer and the twelfth diffusion layer, and the eleventh and twelfth diffusion layers are associated with the second power supply line. A seventh common diffusion layer is shared by the thirteenth diffusion layer and the fourteenth diffusion layer, and the thirteenth and fourteenth diffusion layers are associated with the first power supply line. An eighth common diffusion layer is shared by the fifteenth diffusion layer and the sixteenth diffusion layer, and the fifteenth and sixteenth diffusion layers are associated with the second power supply line. A ninth common diffusion layer is shared by the seventeenth diffusion layer and the eighteenth diffusion layer, and the seventeenth and eighteenth diffusion layers are associated with the third power supply line. A tenth common diffusion layer is shared by the nineteenth diffusion layer and the twentieth diffusion layer, and the nineteenth and twentieth diffusion layers are associated with the fourth power supply line. An eleventh common diffusion layer is shared by the twenty-first diffusion layer and the twenty-second diffusion layer, and the twenty-first and twenty-second diffusion layers are associated with the third power supply line. A twelfth common diffusion layer is shared by the twenty-third diffusion layer and the twenty-fourth diffusion layer, and the twenty-third and twenty-fourth diffusion layers are associated with the fourth power supply line. In this case, a fifth signal propagates on the fifth wiring in the first direction, a seventh signal propagates on the seventh wiring in the first direction, a fourth signal propagates on the fourth wiring in the second direction, and a sixth signal propagates on the sixth wiring in the second direction.

Figure 8D:
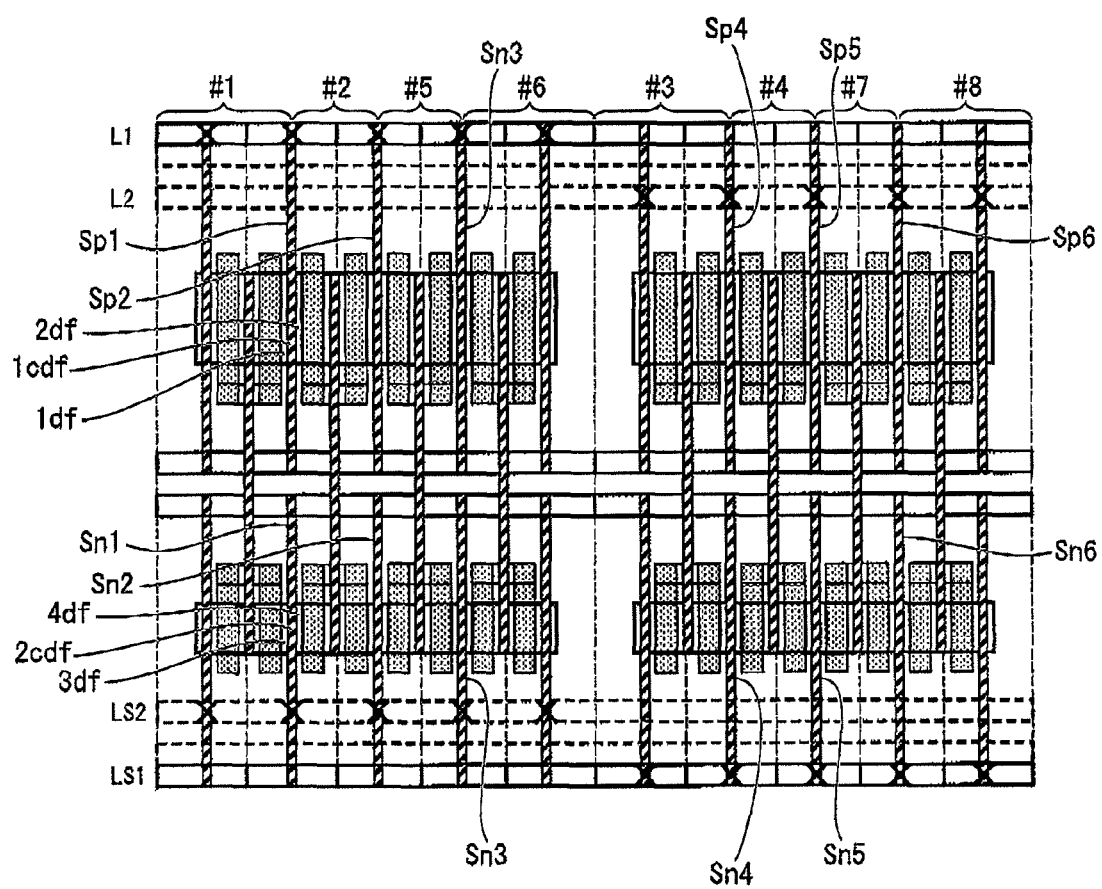
FIG. 8D is a view illustrating an arrangement order of logic circuits in a semiconductor device in accordance with the third embodiment of the present invention.

FIG. 8D is a view illustrating a layout pattern of the logic circuits of FIG. 8C. As an example, the diffusion layers and the common diffusion layers of FIG. 8C are described with reference FIG. 8D. The first circuit #1 includes the first diffusion layer ($1df$) and the third diffusion layer ($3df$). The second circuit #2 includes the second diffusion layer ($2df$) and the fourth diffusion layer ($4df$). In this case, an adjacent portion between the first diffusion layer ($1df$) of the first circuit #1 and the second diffusion layer ($2df$) of the second circuit #2 is used as the first common diffusion layer ($1cdf$). In other words, the first common diffusion layer ($1cdf$) is shared by the first diffusion layer ($1df$) and the second diffusion layer ($2df$). The first diffusion layer ($1df$) and the second diffusion layer ($2df$) are associated with the first power supply line (L1). In the same manner, the second common diffusion layer ($2cdf$) is shared by the third diffusion layer ($3df$) of the first circuit #1 and the fourth diffusion layer ($4df$) of the second circuit #2. The third diffusion layer ($3df$) and the fourth diffusion layer ($4df$) are associated with the second power supply line (LS2). For the circuits #3 and #4, the third common diffusion layer is shared by the fifth diffusion layer and the sixth diffusion layer. The fifth diffusion layer and the sixth diffusion layer are associated with the third power supply line (L2). The fourth common diffusion layer is shared by the seventh diffusion layer and the eighth diffusion layer. The seventh diffusion layer and the eighth diffusion layer are associated with the fourth power supply line (LS1). In the same manner, the other common diffusion layers are shared between the second circuit #2 and the fifth circuit #5, between the fifth circuit #5 and the sixth circuit #6, between the fourth circuit #4 and the seventh circuit #7, and between the seventh circuit #7 and the eighth circuit #8.

Fourth Embodiment

Figure 9A:
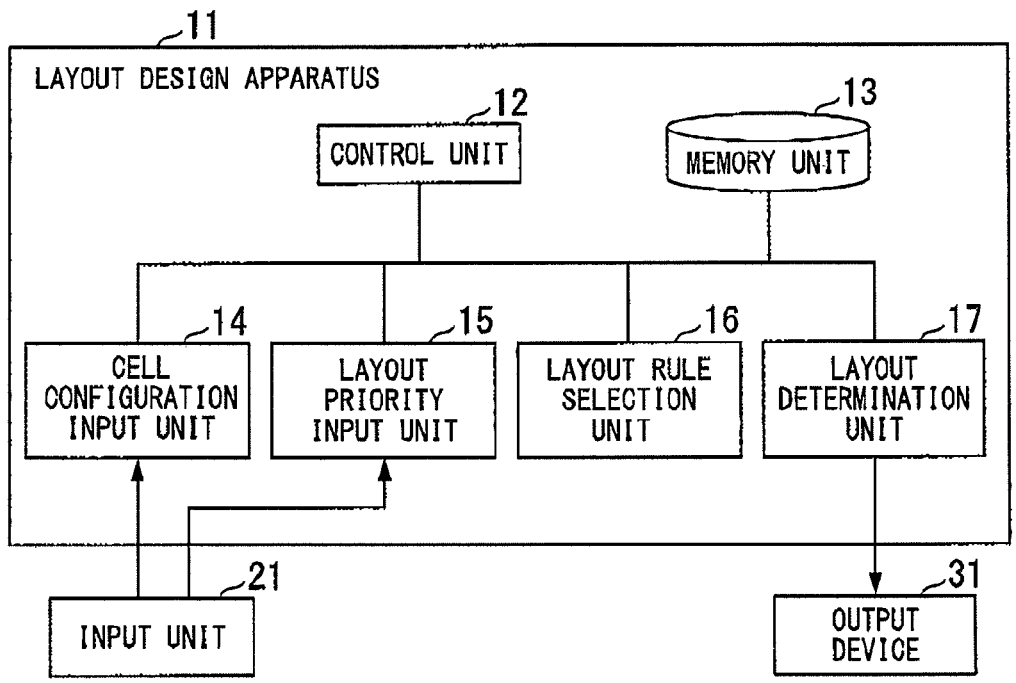
FIG. 9A is a view showing a configuration of a layout design apparatus in accordance with the present invention.

For a fourth embodiment of the present invention, descriptions will be given below for a layout design apparatus which designs the layout of semiconductor devices. FIG. 9A is a diagram showing a layout design apparatus in accordance with the fourth embodiment of the present invention.

A layout design apparatus 11 may be a CAD tool, a personal computer, an information processing device of a work station, or the like, which includes a computer system having a CPU (central processing unit), memories or the like.

In the figure, the layout design apparatus 11 includes a control unit 12, a memory unit 13, a cell configuration input unit 14, a layout priority input unit 15, a layout rule selection unit 16, and a layout determination unit 17. The control unit 12 totally controls each of the units and executes the operations of layout design. The memory unit 13 stores information on layout design rules such as information on logic circuits, information on the priority layout of cells or the like. For the layout design apparatus 11, a CPU reads out a program stored on a memory unit 13 to process data of the information and executes the operations, so that the functions of each of the units can be realized. An input unit 21 is a device which is used to input or read data of the instructions of a layout design into the layout design apparatus 11. The input unit 21 may read the instructions from a data storage media such as a floppy disk, a CD, a DVD, a memory card or the like, or a storage device such as a hard drive or a memory unit, each of which includes data of information on the instructions. The instructions may be input with a keyboard, a mouse, or the like. An output device 31 may be a display unit, a printer device or the like.

The cell configuration input unit 14 of the layout design apparatus 11 receives and stores configuration information from the input unit 21. The configuration indicates that if the cells (logic circuits) of a semiconductor device include a normal configuration or a current source control configuration.

The layout priority input unit 15 reads or receives the priority information from the input unit 21, when the current source control configuration is employed for the cell configuration input unit 14. The priority information indicates that if a layout priority is determined for the reduction of a cell size or determined for the reduction of the number of wirings between device elements.

The layout rule selection unit 16 selects a layout rule based on the instructions of cell configuration indicated by the cell configuration input unit 14 and the priority information indicated by the layout priority input unit 15 referring to the memory unit 13.

Further, the layout determination unit 17 arranges an arrangement order of the cells with the current source control configuration based on the layout rule selected by the layout rule selection unit 16. The data of the result are transmitted to the output device 31. The data of the result may be displayed or printed with the output device 31.

Figure 9B:
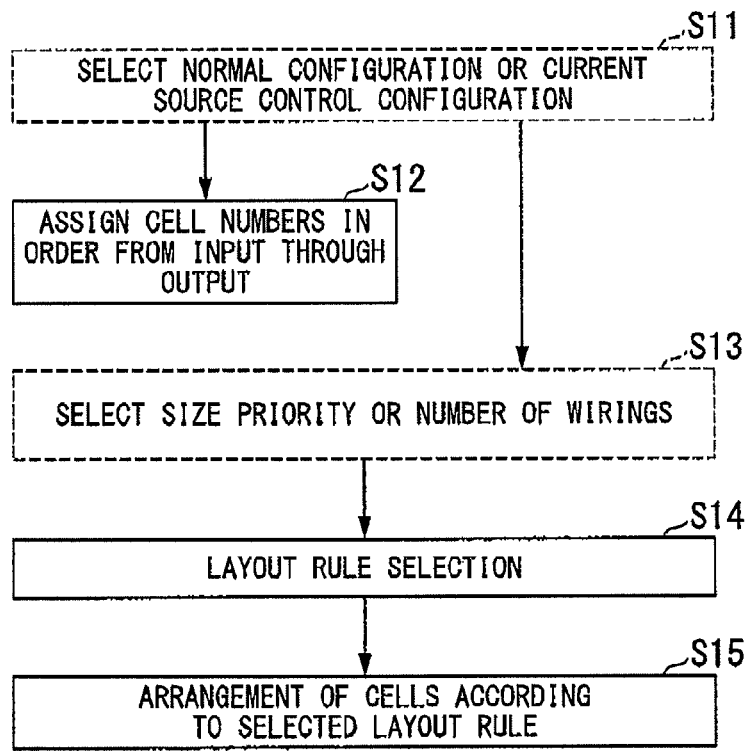
FIG. 9B is a flowchart illustrating an example of a procedure of a device layout.
Figure 10C:
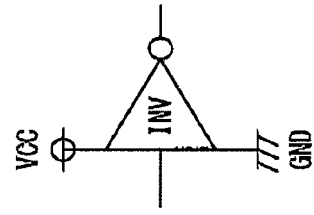
FIG. 10C is a diagram illustrating symbols of the inverter circuits.
Figure 10B:
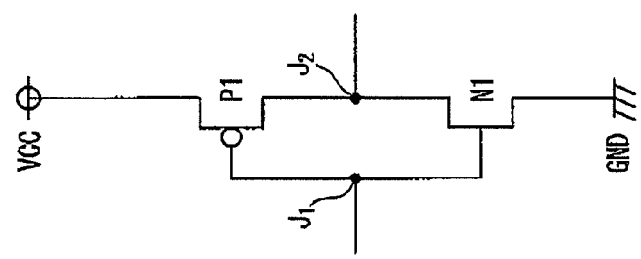
FIG. 10B is a circuit configuration of an inverter circuit.
Figure 10A:
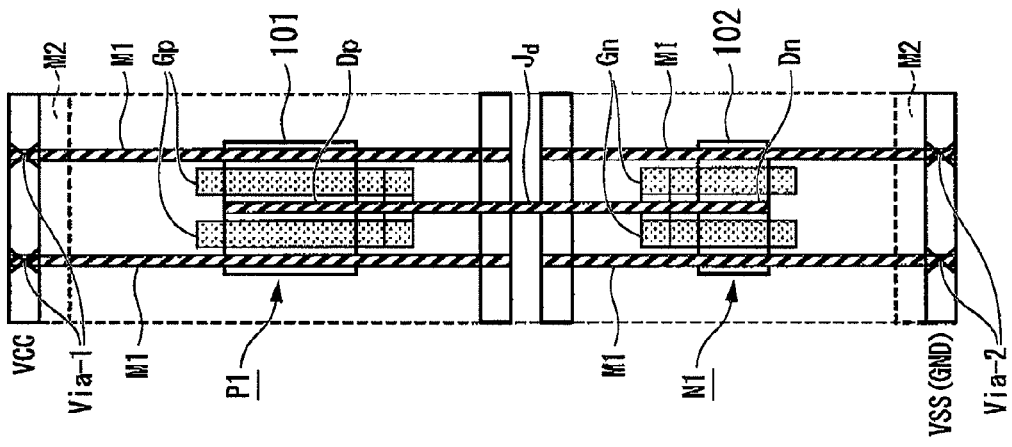
FIG. 10A is an example of a layout of the inverter circuits.

FIG. 9B is a flowchart illustrating an example of a procedure of the layout design apparatus 11. The layout design apparatus 11 performs a layout of the logic circuits based on the arrangement order of the cells.

It will be described about a layout process in accordance with the present embodiment with reference to a flowchart of FIG. 9B. With the input device 21, an operator selects or a predetermined stored program determines that if a semiconductor device to be designed with the normal configuration or the current source control configuration. When the normal configuration is chosen (step S11), the layout process proceeds to step S12, and the layout determination unit 17 arranges layout numbers to the cells in order from an input cell to an output cell (step S12).

When the layout type is selected as the current source control configuration (step S11: logic circuits of the current source control configuration), the operator inputs or the predetermined stored program transmits the priority information into the layout priority input unit 15 with the input unit 21. In this case, the priority information indicates that either a layout is made for the reduction of a cell size or made for the reduction of the number of wirings between device elements (step S13). According to the priority information in step S13, the layout rule selection unit 16 selects a layout rule referring to the memory unit 13 (step S14). The layout determination unit 17 arranges arrangement numbers to the cells having the current source control configuration based on the layout rule selected by the layout rule selection unit 16 (step S15).

According to the layout process above, the priority information (condition) and the layout rule are preliminary determined for the case where the layout design apparatus arranges the layout numbers (order) to the cells having the current source control configuration. In this case, the priority information indicates that either a layout is made based on the reduction of a cell size or a layout is made based on the reduction of the number of wirings transmitting signals between device elements. In this way, it becomes possible for the layout design apparatus to perform a desired layout design of the cells.

As described above, semiconductor devices in accordance with the present invention, the reduction of cell size can be made for a layout of the cells having the current source control configuration by forming the diffusion layers of power supplies. Further, a desired cell configuration can be made by taking into considerations to the number of wirings to connect device elements and the number of common diffusion layers to be connected to power supplies.

Further, the cells (logic circuits) with the current source control configuration described above are not limited to apply to inverter circuits. The present invention can be applied to any other circuits which include the common diffusion layers, in which the common diffusion layers are associated with a power supply which can be used in common. The application according to the present invention is not limited to the cells having the current source control configuration which are used for the reduction of current consumption. Further, the application according to the present invention can be applied to any of other circuits which include configurations where device elements are alternately arranged in the circuits and provided with different power sources (supplies).

As is shown above, the embodiments of the present invention have been described.

It is apparent that the semiconductor devices and the layout design apparatus in accordance with the present invention is not limited to the above embodiments, but may be modified and changed without departing from the scope and spirit of the invention.

A semiconductor device and a method of manufacturing the semiconductor device according to the present invention are applicable to a semiconductor device including a vertical device including a pillar connected to a contact plug, and a method of manufacturing the same.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least 5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a plurality of logic circuits connected to each other through input and output terminals thereof,
   the plurality of logic circuits comprising a first sub-plurality of logic circuits coupled to a first one of different power systems and a second sub-plurality of logic circuits coupled to a second one of the different power systems,
   the first sub-plurality of logic circuits being laid out and adjacent to each other in a first direction,
   the second sub-plurality of logic circuits being laid out and adjacent to each other in the first direction,
   the first sub-plurality of logic circuits and the second sub-plurality of logic circuits being laid out and adjacent to each other in the first direction,
   the first sub-plurality of logic circuits comprising a first logic circuit and a second logic circuit, the second logic circuit being adjacent to the first logic circuit,
   the second sub-plurality of logic circuits comprising a third logic circuit and a fourth logic circuit, the fourth logic circuit being adjacent to the third logic circuit,
   the first logic circuit comprising a first element which comprises a first diffusion layer, the second logic circuit comprising a second element which comprises a second diffusion layer, the third logic circuit comprising a third element which comprises a third diffusion layer, the fourth logic circuit comprising a fourth element which comprises a fourth diffusion layer,
   wherein a first common diffusion layer is shared by the first diffusion layer and the second diffusion layer,
   a second common diffusion layer is shared by the third diffusion layer and the fourth diffusion layer,
   the second logic circuit further comprises a fifth element which comprises a fifth diffusion layer,
   the third logic circuit further comprises a sixth element which comprises a sixth diffusion layer,
   the fifth diffusion layer and the sixth diffusion layer adjoin without including other diffusion layers and,
   the fifth diffusion layer and the sixth diffusion layer are mutually separated.

2. The semiconductor device as claimed in claim 1, wherein the plurality of logic circuits comprises,
   the second and fourth logic circuits forming a first signal path,
   the first and third logic circuits forming a second signal path, and
   the first and second paths forming a first single signal path.

3. The semiconductor device as claimed in claim 2, wherein a first signal propagates on the first signal path in a first signal direction, and
   a second signal propagates on the second signal path in a second signal direction being opposite to the first signal direction.

4. The semiconductor device as claimed in claim 2, wherein the first sub-plurality of logic circuits further comprises a fifth logic circuit,
   the fourth logic circuit and the fifth logic circuit form a third signal path,
   the fifth logic circuit and the third logic circuit form a fourth signal path, and
   the first through fourth signal paths form the first single signal path.

5. The semiconductor device as claimed in claim 3, wherein the first sub-plurality of logic circuits further comprises a fifth logic circuit,
   the fourth logic circuit and the fifth logic circuit form a third signal path,
   the fifth logic circuit and the third logic circuit form a fourth signal path, and
   the first through fourth signal paths form the first single signal path.

6. The semiconductor device as claimed in claim 4, wherein the first signal propagates on the first signal path in the first signal direction, a third signal propagates on the third signal path in the first signal direction, the second signal propagates on the second signal path in a second signal direction being opposite to the first signal direction, and a fourth signal propagates on the fourth signal path in the second signal direction.

7. The semiconductor device as claimed in claim 2, wherein the first signal propagates on the first signal path in the first signal direction, and the second signal propagates on the second signal path in the first signal direction.

8. The semiconductor device as claimed in claim 7, wherein the third logic circuit and the second logic circuit form a fifth signal path, and a fifth signal propagates on the fifth signal path in the second signal direction being opposite to the first signal direction.

9. The semiconductor device as claimed in claim 1, wherein each of the first sub-plurality of logic circuits forms a first signal path which bypasses other logic circuits included in the first sub-plurality of logic circuits, and each of the second sub-plurality of logic circuits forms a second signal path which bypasses other logic circuits included in the second sub-plurality of logic circuits.

10. The semiconductor device as claimed in claim 2, wherein each of the first sub-plurality of logic circuits bypasses other logic circuits included in the first sub-plurality of logic circuits, and each of the second sub-plurality of logic circuits bypasses other logic circuits included in the second sub-plurality of logic circuits.

11. The semiconductor device as claimed in claim 3, wherein each of the first sub-plurality of logic circuits bypasses other logic circuits included in the first sub-plurality of logic circuits, and each of the second sub-plurality of logic circuits bypasses other logic circuits included in the second sub-plurality of logic circuits.

12. The semiconductor device as claimed in claim 7, wherein each of the first sub-plurality of logic circuits bypasses other logic circuits included in the first sub-plurality of logic circuits, and each of the second sub-plurality of logic circuits bypasses other logic circuits included in the second sub-plurality of logic circuits.

13. The semiconductor device as claimed in claim 1, wherein each of the first, second, third, fourth, fifth and sixth elements is a field effect transistor, and each of the first, second, third, fourth, fifth and sixth diffusion layers is one of electrodes of the field effect transistor.

14. A semiconductor device comprising:

a first circuit, a second circuit and a fifth circuit, each of the first, second and fifth circuits being driven between a first power supply line having a first electrical potential and a second power supply line having a second electrical potential, the first electrical potential being higher than the second electrical potential, the first circuit comprising a first diffusion layer and a third diffusion layer, the second circuit comprising a second diffusion layer and a fourth diffusion layer;

a third circuit and a fourth circuit, each of the third and fourth circuits being driven between a third power supply line having a third electrical potential and a fourth power supply line having a fourth electrical potential, the third electrical potential being higher than the fourth electrical potential, the third circuit comprising a fifth diffusion layer and a seventh diffusion layer, the fourth circuit comprising a sixth diffusion layer and an eighth diffusion layer, wherein a second output terminal of the second circuit is connected through a first wiring to a fourth input terminal of the fourth circuit, a fourth output terminal of the fourth circuit is connected through a second wiring to a fifth input terminal of the fifth circuit, a fifth output terminal of the fifth circuit is connected through a third wiring to a third input terminal of the third circuit, a third output terminal of the third circuit is connected through a fourth wiring to a first input terminal of the first circuit, a second input terminal of the second circuit receives an input signal, a first output terminal of the first circuit outputs an output signal, the first, second, third, fourth and fifth circuits are disposed in series in a first direction, a first common diffusion layer is shared by the first diffusion layer and the second diffusion layer, the first and second diffusion layers associated with the first power supply line, a second common diffusion layer is shared by the third diffusion layer and the fourth diffusion layer, the third and fourth diffusion layers associated with the second power supply line, a third common diffusion layer is shared by the fifth diffusion layer and the sixth diffusion layer, the fifth and sixth diffusion layers associated with the third power supply line, a fourth common diffusion layer is shared by the seventh diffusion layer and the eighth diffusion layer, the seventh and eighth diffusion layers associated with the fourth power supply line, a first signal propagates on the first wiring in the first direction, a second signal propagates on the second wiring in the first direction, a third signal propagates on the third wiring in a second direction being opposite to the first direction, and a fourth signal propagates on the fourth wiring in the second direction.

15. A device comprising:

first and second power supply lines;

first and second sub power supply lines;

a first transistor coupled between the first power supply line and the first sub power supply line;

a second transistor coupled between the second power supply line and the second sub power supply line;

a first logic circuit coupled between the first power supply line and the second sub power supply line;

a second logic circuit couple between the first sub power supply line and the second power supply line, the second logic circuit being coupled to an output node of the first logic circuit at an input node thereof;

a third logic circuit coupled between the first power supply line and the second sub power supply line, the third logic circuit being coupled to an output node of the second logic circuit at an input node thereof; and the first logic circuit being sandwiched between the third and second logic circuits.

16. The device as claimed in claim 15, wherein each of the first and second power supply lines is elongated in a first direction, each of the first and second sub power supply lines is elongated in the first direction, and the first, second and third logic circuits are arranged in line in the first direction.

17. The device as claimed in claim 15, wherein the first logic circuit includes a third transistor of a first channel type, the third logic circuit includes a fourth transistor of the first channel type, one of source and drain of the third transistor and one of source and drain of the fourth transistor are formed by a common diffusion layer.

18. The device as claimed in claim 17, wherein the first logic circuit includes a fifth transistor of a second channel type different from the first channel type, the third logic circuit includes a sixth transistor of the second channel type, one of source and drain electrodes of the fifth transistor and one of source and drain of the sixth transistor are formed by a common diffusion layer.

19. The device as claimed in claim 15, wherein each of the first, second and third logic circuits is an inverter circuit.

20. The device as claimed in claim 15, wherein each of the first and second transistors is a power gating transistor.

* * * * *